United States Patent
Minato et al.

(10) Patent No.: US 9,025,336 B2
(45) Date of Patent: May 5, 2015

(54) LINKED SEMICONDUCTOR MODULE UNIT AND ELECTRONIC CIRCUIT-INTEGRATED MOTOR DEVICE USING SAME

(71) Applicant: Denso Corporation, Kariya, Aichi-pref. (JP)

(72) Inventors: Hideki Minato, Nagoya (JP); Hideki Kabune, Nagoya (JP); Atsushi Furumoto, Nukata-gun (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 14/094,217

(22) Filed: Dec. 2, 2013

(65) Prior Publication Data

US 2014/0084722 A1 Mar. 27, 2014

Related U.S. Application Data

(62) Division of application No. 12/822,412, filed on Jun. 24, 2010, now Pat. No. 8,630,095.

(30) Foreign Application Priority Data

Jun. 24, 2009 (JP) ................................. 2009-149647
Jan. 28, 2010 (JP) .................................. 2010-17450

(51) Int. Cl.
*H05K 5/00* (2006.01)
*H02K 11/00* (2006.01)
(Continued)

(52) U.S. Cl.
CPC .......... *H02K 11/0094* (2013.01); *H01L 21/561* (2013.01); *H01L 23/3107* (2013.01); *H01L 23/49541* (2013.01); *H01L 24/48* (2013.01); *H01L 25/072* (2013.01); *H01L 2224/48247* (2013.01); *H01L 2924/13091* (2013.01); *H01L 2924/14* (2013.01); *H01L 2924/19041* (2013.01); *H01L 2924/19042* (2013.01); *H01L 2924/19043* (2013.01); *H01L 2924/30105* (2013.01);
(Continued)

(58) Field of Classification Search
USPC ............. 361/730; 62/228.4, 259.2; 310/1, 52, 310/62, 71, 89, 429; 219/623; 318/139, 318/432, 689; 180/444
See application file for complete search history.

(56) References Cited

U.S. PATENT DOCUMENTS 5,406,154 A * 4/1995 Kawaguchi et al. ........ 310/67 R
5,552,988 A   9/1996 Kawaguchi et al.
(Continued)

FOREIGN PATENT DOCUMENTS

JP   2-37578    3/1990
JP   10-234158  9/1998
(Continued)

OTHER PUBLICATIONS

U.S. Appl. No. 12/822,396, Yamasaki et al., filed Jun. 24, 2010.
(Continued)

*Primary Examiner* — Xiaoliang Chen
(74) *Attorney, Agent, or Firm* — Nixon & Vanderhye P.C.

(57) ABSTRACT

A linked semiconductor module unit links a plurality of semiconductor modules by a first bus bar and a second bus bar, which are embedded in resin parts. The linked semiconductor module unit is disposed in a place other than on a printed circuit board. The semiconductor module linking structure is implemented readily by molding the bus bars together with semiconductor chips and lands to form the resin parts.

5 Claims, 30 Drawing Sheets

(51) Int. Cl.
*H01L 21/56* (2006.01)
*H01L 23/495* (2006.01)
*H01L 25/07* (2006.01)
*H02K 3/52* (2006.01)
*H02K 11/02* (2006.01)
*H02K 9/22* (2006.01)
*H01L 23/31* (2006.01)
*H01L 23/00* (2006.01)

(52) U.S. Cl.
CPC ............ *H02K3/522* (2013.01); *H02K 11/0073* (2013.01); *H02K 11/024* (2013.01); *H02K 2211/03* (2013.01); *H01L 2924/01019* (2013.01); *H01L 2924/01068* (2013.01); *H02K 9/22* (2013.01); *H01L 2924/1306* (2013.01)

(56) References Cited

U.S. PATENT DOCUMENTS

| | | | |
|---|---|---|---|
| 6,037,726 | A | 3/2000 | Tabata et al. |
| 6,054,818 | A | 4/2000 | Tabata et al. |
| 6,081,056 | A | 6/2000 | Takagi et al. |
| 7,741,708 | B2 | 6/2010 | Muramatsu et al. |
| 2003/0173839 | A1* | 9/2003 | Torii et al. ............ 310/52 |
| 2003/0173920 | A1 | 9/2003 | Tominaga et al. |
| 2003/0200761 | A1* | 10/2003 | Funahashi et al. ....... 62/228.4 |
| 2004/0090130 | A1 | 5/2004 | Kaneko et al. |
| 2005/0104460 | A1 | 5/2005 | Kusase et al. |
| 2005/0223727 | A1 | 10/2005 | Funahashi et al. |
| 2005/0269895 | A1 | 12/2005 | Innami et al. |
| 2006/0064998 | A1 | 3/2006 | Funahashi et al. |
| 2006/0138883 | A1 | 6/2006 | Yagai et al. |
| 2006/0169526 | A1 | 8/2006 | Honbo et al. |
| 2006/0175906 | A1 | 8/2006 | Hino et al. |
| 2007/0023421 | A1 | 2/2007 | Kitamura et al. |
| 2007/0045037 | A1* | 3/2007 | Yoshinari et al. ........... 180/444 |
| 2007/0096278 | A1 | 5/2007 | Nakatsu et al. |
| 2007/0222330 | A1 | 9/2007 | Innami et al. |
| 2007/0246289 | A1* | 10/2007 | Tominaga .................. 180/444 |
| 2008/0100171 | A1 | 5/2008 | Nakajima et al. |
| 2008/0136265 | A1 | 6/2008 | Mizukoshi et al. |
| 2008/0226474 | A1 | 9/2008 | Yoshida et al. |
| 2008/0290477 | A1 | 11/2008 | Muramatsu et al. |
| 2009/0039729 | A1 | 2/2009 | Innami et al. |
| 2009/0058407 | A1 | 3/2009 | Kanekawa et al. |
| 2009/0127948 | A1 | 5/2009 | Shimizu et al. |
| 2009/0160048 | A1 | 6/2009 | Nakatsu et al. |
| 2009/0243407 | A1 | 10/2009 | Kato et al. |
| 2009/0295325 | A1 | 12/2009 | Sekine et al. |
| 2010/0025126 | A1 | 2/2010 | Nakatsu et al. |
| 2010/0026090 | A1 | 2/2010 | Nakatsu et al. |
| 2010/0295498 | A1 | 11/2010 | Tominaga et al. |

FOREIGN PATENT DOCUMENTS

| | | |
|---|---|---|
| JP | 10-322973 | 12/1998 |
| JP | 2000-049271 | 2/2000 |
| JP | 2002-048099 | 2/2002 |
| JP | 2002-345211 | 11/2002 |
| JP | 2004-159454 | 6/2004 |
| JP | 2004-236470 | 8/2004 |
| JP | 2007-215299 | 8/2007 |
| JP | 2008-131794 | 6/2008 |
| JP | 2008-167641 | 7/2008 |
| JP | 2009-278134 | 11/2009 |
| WO | 2010/150527 | 12/2010 |
| WO | 2010/150528 | 12/2010 |
| WO | 2010/150529 | 12/2010 |
| WO | 2010/150530 | 12/2010 |

OTHER PUBLICATIONS

U.S. Appl. No. 12/822,403, Minato et al., filed Jun. 24, 2010.
U.S. Appl. No. 12/822,614, Fujita et al., filed Jun. 24, 2010.
U.S. Appl. No. 12/822,635, Miyachi et al., filed Jun. 24, 2010.
U.S. Appl. No. 12/822,381, Iwai et al., filed Jun. 24, 2010.
U.S. Appl. No. 12/822,627, Yamasaki et al., filed Jun. 24, 2010.
Japanese Office Action issued for Japanese Patent Application No. 2010-017450, dated May 14, 2013.
Japanese Office Action issued for Japanese Patent Application No. 2010-017450, dated Dec. 11, 2012.

* cited by examiner

LINKED SEMICONDUCTOR MODULE UNIT AND ELECTRONIC CIRCUIT-INTEGRATED MOTOR DEVICE USING SAME

CROSS REFERENCE TO RELATED APPLICATION

This application is a divisional of U.S. patent application Ser. No. 12/822,412, filed Jun. 24, 2010, currently allowed, which claims priority to Japanese Patent Application No. 2009-149647, filed on Jun. 24, 2009, and Japanese Patent Application No. 2010-17450, filed on Jan. 28, 2010, the entire contents of each of which are hereby incorporated by reference

FIELD OF THE INVENTION

The present invention relates to a linked semiconductor module unit and an electronic circuit-integrated motor device using the linked semiconductor module unit.

BACKGROUND OF THE INVENTION

In a conventional electric motor device, many electronic parts, such as transistors and other semiconductor elements, resistors and capacitors, are coupled together and mounted on a wiring pattern of a printed circuit board as exemplified in the patent document (JP 2002-345211A).

According to the patent document, for example, six switching elements are provided and selectively turned on or off to control the conduction timing of coil currents supplied to three-phase coils. This forms a rotating magnetic field for the purpose of driving a brushless motor. These switching elements are formed as a plurality of independent semiconductor modules. The semiconductor modules are linked together and mounted on the conductive wiring pattern of the printed circuit board.

SUMMARY OF THE INVENTION

It is an object of the present invention to provide a linked semiconductor module unit including a plurality of semiconductor modules without using a printed circuit board.

It is another object of the present invention to provide an electronic circuit-integrated motor device that uses the linked semiconductor module unit.

According to one aspect of the present invention, a linked semiconductor module unit is formed by a plurality of semiconductor modules and a linking member. Each of the plurality of semiconductor modules includes at least one semiconductor chip, a land on which the semiconductor chip is mounted, and a resin part that encapsulates the semiconductor chip and embeds the land. The linking member is embedded in the resin part to link the plurality of semiconductor modules. The linking member is configured such that a plurality of embedded portions of the plurality of semiconductor modules, which are embedded in the resin part, and an exposed portion, which is placed between the embedded portions and exposed from the resin part, are formed integrally and continuously.

According to another aspect of the present invention, the above linked semiconductor module unit is provided in an electronic circuit-integrated motor device, so that a current supplied to a multiple-phase coil of a motor is changed by the plurality of semiconductor modules.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

A linked semiconductor module unit according to the present invention will now be described with reference to the accompanying drawings.

First Embodiment

An electronic circuit-integrated motor device according to the first embodiment is provided for an electric power assist system such as an electric power steering system (EPS system), which is a power assist system.

Figure 6:
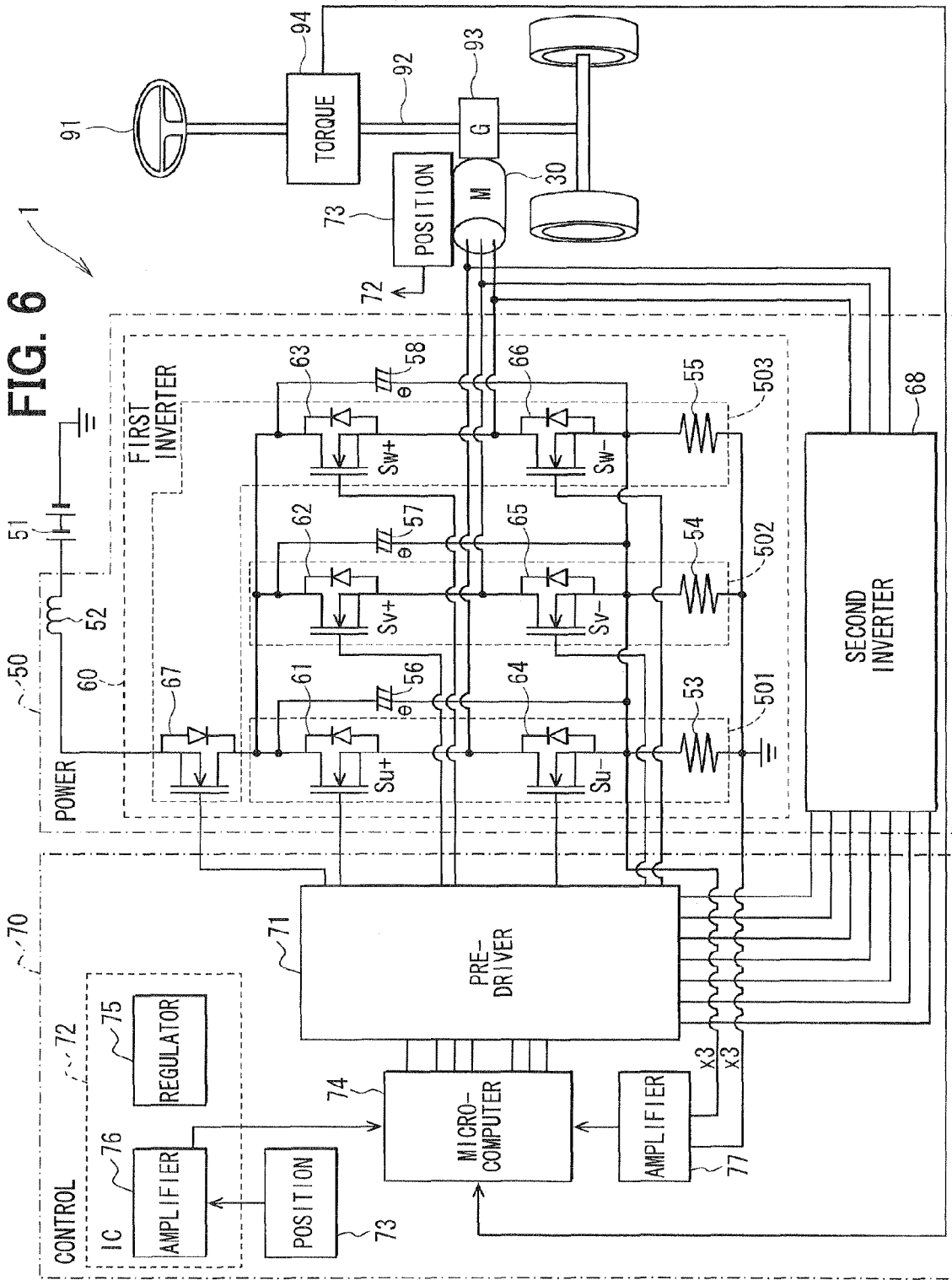
FIG. 6 is an electric circuit diagram showing an electric power steering system of a vehicle that uses the linked semiconductor module unit according to the first embodiment.

Referring to FIG. 6, an electronic circuit-integrated motor device 1 includes a motor 30, a power circuit 50 and a control circuit 70. The electronic circuit-integrated motor device 1 provides steering assist to a steering wheel 91 of a vehicle by generating a rotary torque for a column shaft 92 through a gear 93 mounted on the column shaft 92, which is a rotating shaft of the steering wheels 91. More specifically, when the steering wheel 91 is operated by a driver, a torque sensor 94 detects a steering torque that is generated for the column shaft 92 as a result of steering. Further, vehicle a speed signal is acquired from a CAN (control area network), which is not shown, to provide steering assist to the driver who steers the steering wheel 91. The use of the this mechanism, depending on the employed control method, will make it possible not only to provide steering assist, but also to provide automatic control of operations of the steering wheel 91 for the purpose, for instance, of causing the vehicle to stay in a traffic lane on an expressway or guiding the vehicle into a parking space in a parking lot.

The motor 30 is a brushless motor that rotates the gear 93 in a normal direction and in a reverse direction. The power circuit 50 supplies electrical power to the motor 30. The power circuit 50 includes a choke coil 52, which is positioned in a power supply cable from a power source 51, shunt resistors 53, 54, 55, aluminum electrolytic capacitors 56, 57, 58, and a set of two inverter circuits, that is, a first inverter circuit 60 and a second inverter circuit 68. As the first inverter circuit 60 and the second inverter circuit 68 have substantially the same circuit configuration, the first inverter circuit 60 will be mainly described below.

The first inverter circuit 60 includes seven metal oxide semiconductor field effect transistors (MOSFETs) 61, 62, 63, 64, 65, 66, 67, which are classified as one of a variety of types of field effect transistors. The MOSFETs 61 to 67 are switching elements. More specifically, the path between the source and drain of each MOSFET turns on (closes) or off (opens) depending on the electric potential applied to the gate.

The MOSFETs 61 to 67 are hereinafter referred to as FETs 61 to 67, respectively. The FETs 61 to 66 may be individually referred to as the FET (Su+) 61, FET (Sv+) 62, FET (Sw+) 63, FET (Su−) 64, FET (Sv−) 65, and FET (Sw−) 66. The FET 67 closest to the power source 51 is provided to protect the FETs 61 to 66 of the power circuit 50 from reverse connection of the power source 51. More specifically, the FET 67, which is connected in a direction opposite to that of the FETs 61 to 66, serves as a power relay that prevents an electrical current from flowing in a reverse direction when the power source 51 is erroneously connected in polarity.

The remaining six FETs 61 to 66 are described below. The FETs 61 to 66 are switching elements that change coil currents flowing to multiple-phase coils for driving the motor 30, that is, three-phase windings.

The gates of the FETs 61 to 66 are connected to six output terminals of a pre-driver circuit 71.

The drain of the FET (Su+) 61 is connected to the power supply cable, and the source thereof is connected to the drain of the FET (Su−) 64. The drain of the FET (Sv+) 62 is connected to the power supply cable, and the source thereof is connected to the drain of the FET (Sv−) 65. The drain of the FET (Sw+) 63 is connected to the power supply cable, and the source thereof is connected to the drain of the FET (Sw−) 66.

The drain of the FET (Su−) 64 is connected to the source of the FET (Su+) 61, and the source thereof is connected to the ground (ground cable). The drain of the FET (Sv−) 65 is connected to the source of the FET (Sv+) 62, and the source thereof is connected to the ground. The drain of the FET (Sw−) 66 is connected to the source of the FET (Sw+) 63, and the source thereof is connected to the ground.

Three connection points (junctions) between the series-connected FETs among FETs 61 to 66 are respectively connected to a U-phase coil, a V-phase coil, and a W-phase coil of the motor 30. More specifically, the junction between the FET (Su+) 61 and the FET (Su−) 64 is connected to the U-phase coil, the junction between the FET (Sv+) 62 and the FET (Sv−) 65 is connected to the V-phase coil, and the junction between the FET (Sw+) 63 and the FET (Sw−) 66 is connected to the W-phase coil.

It is noted that the FETs 61, 62 are packaged as a semiconductor module 501, the FETs 62, 65 are packaged as a semiconductor module 502, and the FETs 63, 66, 67 are packaged as a semiconductor module 503.

The aluminum electrolytic capacitor 56 is connected in parallel between the power supply cable of the FET (Su+) 61 and the ground of the FET (Su−) 64. Similarly, the aluminum electrolytic capacitor 57 is connected in parallel between the power supply cable of the FET (Sv+) 62 and the ground of the FET (Sv−) 65. The aluminum electrolytic capacitor 58 is connected in parallel between the power supply cable of the FET (Sw+) 63 and the ground of the FET (Sw−) 66. Each of the aluminum electrolytic capacitors 56 to 58 are simply referred to as the capacitor.

The choke coil 52 is provided to reduce power supply noise. The capacitors 56 to 58 store electrical charge to assist the supply of electrical power to the FETs 61 to 66 and suppress a surge voltage and other electric noise components. Even when an erroneous power source connection is made, the capacitors 56 to 58 are not damaged or broken, because the FET 67 is provided in series between the power source 51 and the inverter circuit 60 to provide protection against reverse connection.

The shunt resistors 53 to 55 are used to detect the amount of current flowing to the series-connected FETs.

The control circuit 70 includes the pre-driver circuit 7, a customized integrated circuit (custom IC) 72, a position sensor 73, a microcomputer 74, and a detected voltage amplifier circuit 77. The custom IC 72 includes two functional blocks, that is, a regulator circuit 75, and a position sensor signal amplifier circuit 76.

The regulator circuit 75 is a stabilization circuit that stabilizes the power source voltage. The regulator circuit 75 stabilizes the supply of electrical power to various units. For example, the regulator circuit 75 ensures that the microcomputer 74 operates on a predetermined stabilized supply voltage (e.g., 5 V).

The position sensor signal amplifier circuit 76 inputs a signal from the position sensor 73. The position sensor 73 is provided in the motor 30 and outputs a rotational position signal of the motor 30. The position sensor signal amplifier circuit 76 amplifies the rotational position signal and outputs the amplified rotational position signal to the microcomputer 74.

The detected voltage amplifier circuit 77 detects voltages across the shunt resistors 53 to 55 installed in the power circuit 50, amplifies the detected voltages indicative of the coil currents supplied to the motor 30, and outputs the amplified voltages to the microcomputer 74.

Consequently, the rotational position signal of the motor 30 and the voltages across the shunt resistors 53 to 55 are applied to the microcomputer 74. A steering torque signal is also applied to the microcomputer 74 from the torque sensor 94 mounted on the column shaft 92. In addition, the vehicle speed signal enters the microcomputer 74 through the CAN.

Upon receipt of the steering torque signal and the vehicle speed signal, the microcomputer 74 controls the inverter circuits 60, 68 through the pre-driver circuit 71 in accordance with the rotational position signal and in such a manner as to provide steering assist to the steering wheel 91 in accordance with vehicle speed. More specifically, the inverter circuits 60, 68 are controlled by turning on or off the FETs 61 to 66 through the pre-driver circuit 71. As the gates of the six FETs 61 to 66 are connected to the six output terminals of the pre-driver circuit 71, the pre-driver circuit 71 can change the potentials of the gates.

Further, the microcomputer 74 controls the inverter circuits 60, 68 in accordance with the voltages across the shunt resistors 53 to 55, which are input from the detected voltage amplifier circuit 77, so that the electrical current in generally a sine wave form is supplied to the motor 30.

Each of the electrical and mechanical parts of the electronic circuit-integrated motor device 1 is arranged as shown in FIGS. 7 to 12.

Figure 9:
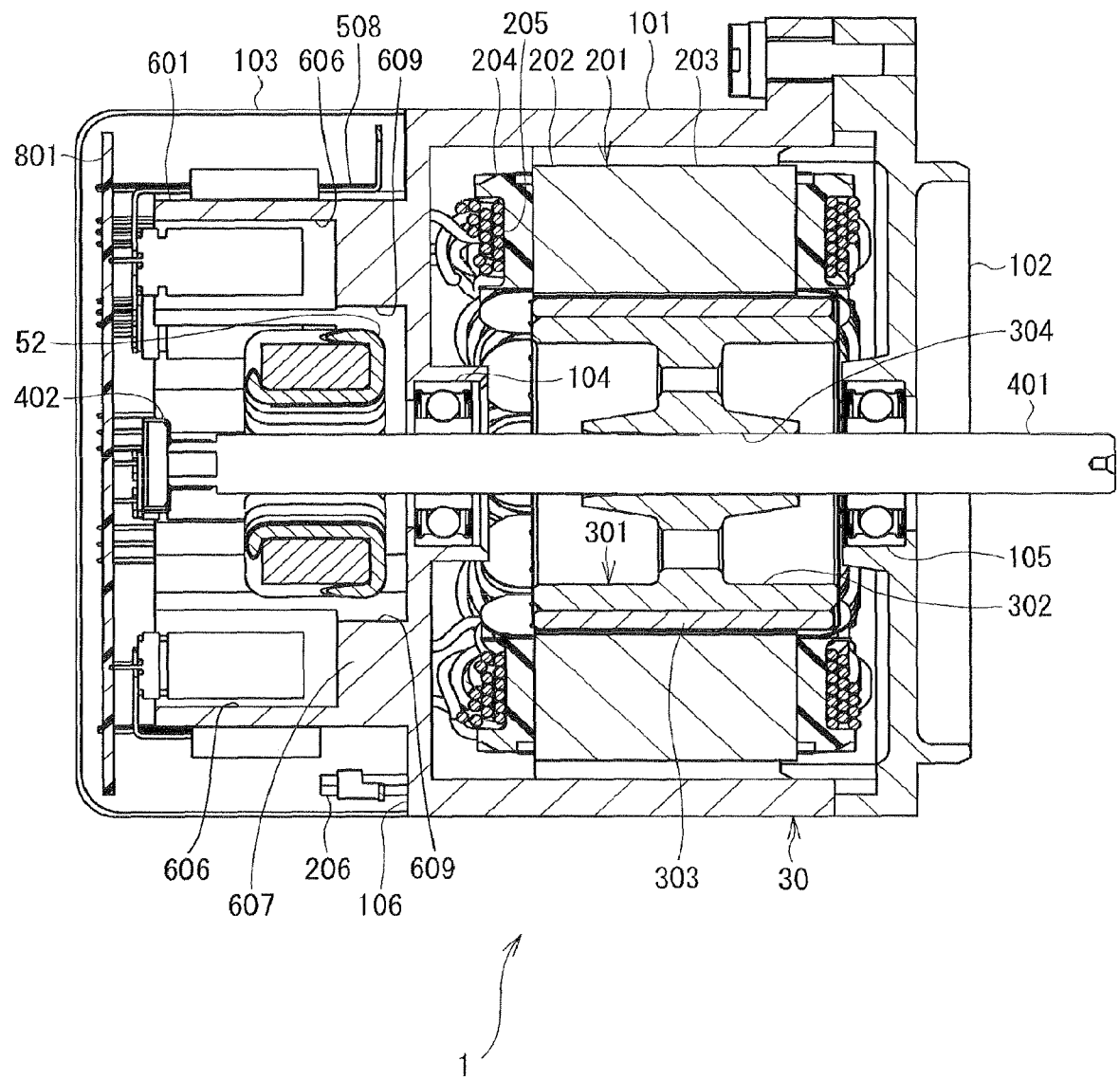
FIG. 9 is a cross-sectional view of the electronic circuit-integrated motor device taken along the line IX-IX in FIG. 8.

As best shown in FIG. 9, the electronic circuit-integrated motor device 1 has a motor housing that includes a tubular motor case 101, which is in a bottomed cylindrical shape having a cylindrical part and an end wall 106 at one axial end of the cylindrical part; an end frame 102, which is screw-fastened to the other axial end of the cylindrical part of the motor case 101; and a cover 103, which is in a bottomed cylindrical shape fitted over the end wall 106 to cover electronic circuit part therein. An electric connector (not shown) for connection to the power source 51 is attached to the cover 103. Electrical power is supplied to bus bars 16 to 19 through this connector.

The motor 30 also has a stator 201 positioned on the radially inside part of the motor case 101, a rotor 301 positioned on the radially inside part of the stator 201, and a shaft 401 that is fit firmly in the rotor 301 to rotate together with the rotor 301.

The stator 201 includes twelve salient poles 202, which protrude in the radially inward direction of the motor case 101. The salient poles 202 are disposed at predetermined angular intervals in the circumferential direction of the motor case 101. The salient poles 202 each include a multilayer core 203, which is formed by a stack of thin magnetic plates, and an insulator 204, which fits with the axially outer end of the multilayer core 203. Coils (windings) 205 are wound on the insulator 204. Each of the coils 205 is a three-phase winding of a U-phase, a V-phase or a W-phase and has two sets of U-phase, V-phase or W-phase. Either the first inverter circuit 60 or the second inverter circuit 68 controls the supply of electrical power to the individual sets of U-phase, V-phase and W-phase. A lead wire 206 for supplying electrical power to the coil 205 is connected to six points of the coils 205 and routed toward the electronic circuit from six holes provide in the axial end of the motor case 101. As described later, the lead wire 206 is routed from the axial end wall 106 of the motor case 101 to the radially outside part of semiconductor modules 501 to 506, which is shown in FIG. 6. In a radially outer space of the semiconductor modules 501 to 506, the lead wire 206 and coil terminal 508 are electrically connected as exemplarily shown in FIG. 10 in such a manner that the lead wire 206 is clamped in the coil terminal 508. It is noted that the lead wire 206 is shown as two wires, assuming that the coils 205 are connected in Δ-shape.

The rotor 301 is made, for instance, of iron or other magnetic materials and formed into tubular shape. The rotor 301 includes a rotor core 302 and permanent magnets 303 that are fixed to the radially outside part of the rotor core 302. The permanent magnets 303 include a total of ten poles, more specifically, five N poles and five S poles, which are alternately disposed in the circumferential direction.

The shaft 401 is fixedly fastened to a shaft hole 304 formed at the axial and radial center of the rotor core 302. The shaft 401 is rotatably supported by a bearing 104 on an axial end wall 106 of the motor case 101 and by a bearing 105 on the end frame 102. This ensures that the shaft 401 can rotate together with the rotor 301 with respect to the stator 201. The shaft 401 extends toward the electronic circuit section. The end of the shaft 401 that is positioned toward the electronic circuit section is provided with a magnet 402 for detecting the rotational position. A printed circuit board 801, which is made of resin, is positioned near the end of the shaft 401 that is positioned toward the electronic circuit section. The printed circuit board 801 is positioned in a space between the cover 103 and a heat sink 601 that is formed integrally with the motor case 101. The control circuit 70 (not shown in FIG. 9, but shown in FIG. 6) is formed on the printed circuit board 801. More specifically, a conductive wiring pattern is formed on the printed circuit board 801 by etching or other method, and an IC or other circuit forming the control circuit 70 is mounted on the printed circuit board 801. The position sensor 73 (not shown in FIG. 9, but shown in FIG. 6) is also mounted at the center of the printed circuit board 801. The position sensor 73 detects the rotational position of the magnet 402, that is, the rotational position of the shaft 401. A virtual straight line obtained by extending the central axis of the shaft 401 is referred to as the rotation axis of the motor 30.

As shown in FIGS. 7 to 11, particularly in FIG. 9, the heat sink 601 is formed on the motor case 101. The heat sink 601 is formed on the axial end wall 106 of the motor case 101 in a raised or protruded manner. The heat sink 601 is formed integrally with the motor case 101 and extends in the axial direction of the shaft 401 toward the printed circuit board 801. The heat sink 601 includes two columnar members 602. Their cross sections, which are perpendicular to the axial direction of the shaft 401 are substantially trapezoidal in shape. The two columnar members 602 are disposed in such a manner that the rotation axis of the motor 30 is sandwiched therebetween as exemplified in FIG. 7. Further, the columnar members 602 each have an arc portion 609 that is cut to form an arc around the rotation axis of the motor 30. The arc portion 609 forms a cylindrical space at the center of the heat sink 601. That is, the heat sink 601 is formed in a shape, which is like a thick-walled cylinder that is octagon-shaped when viewed in the axial direction. Obviously, the heat sink 601 need not always be octagon-shaped when viewed in the axial direction. Alternatively, it may be hexagon-shaped when viewed in the axial direction. The two columnar members 602 are formed so that they are not contiguous. A portion that makes the columnar members 602 noncontiguous includes the arc portion 609, which is cut to form an arc around the rotation axis of the motor 30, and planar cut surfaces 603, 604, which are formed on both sides of the arc portion 609.

The columnar members 602 of the heat sink 601 have outer sidewall surfaces 605, which are wider than a side wall surface that faces in a radially outward direction and contiguous with the cut surfaces 603, 604. A total of six radially outer sidewall surfaces 605 are formed circumferentially. Accommodation sections 606 are formed as recesses in a position that corresponds to the radially inside part of the columnar members 602 and to each sidewall surface 605. The accommodation sections 606 are open to a cylindrical space around the rotation axis of the motor 30, which is formed by the arc portion 609. The accommodation sections 606 have an arc surface that defines the radially outside part of the accommodation sections 606 and fits to the outside diameters of capacitors 701 to 706. Further, the accommodation sections 606 are in a position that corresponds to the position of the sidewall surfaces 605, and formed opposite the semiconductor modules 501 to 506 with the columnar members 602 positioned between the accommodation sections 606 and the semiconductor modules 501 to 506. Although a portion of the heat sink 601, on which the accommodation sections 606 are formed, is thinned, a thick portion 607, which is as thick as a portion where the accommodation sections 606 are not positioned, is formed between the accommodation sections 606 and the end wall 106 of the motor case 101 as shown in FIG. 9.

Figure 8:
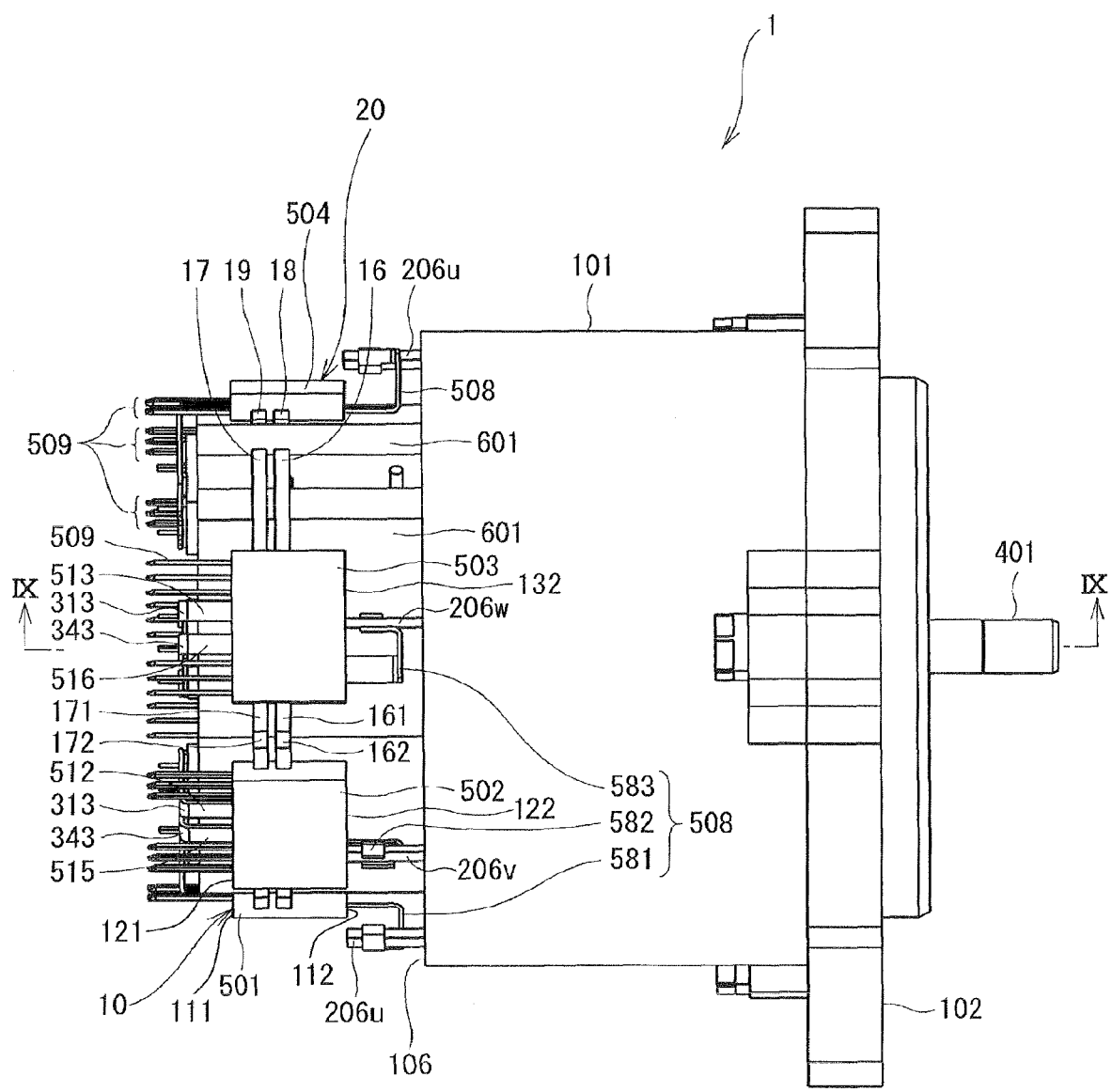
FIG. 8 is a side view showing the electronic circuit-integrated motor device that uses the linked semiconductor module unit according to the first embodiment.
Figure 10:
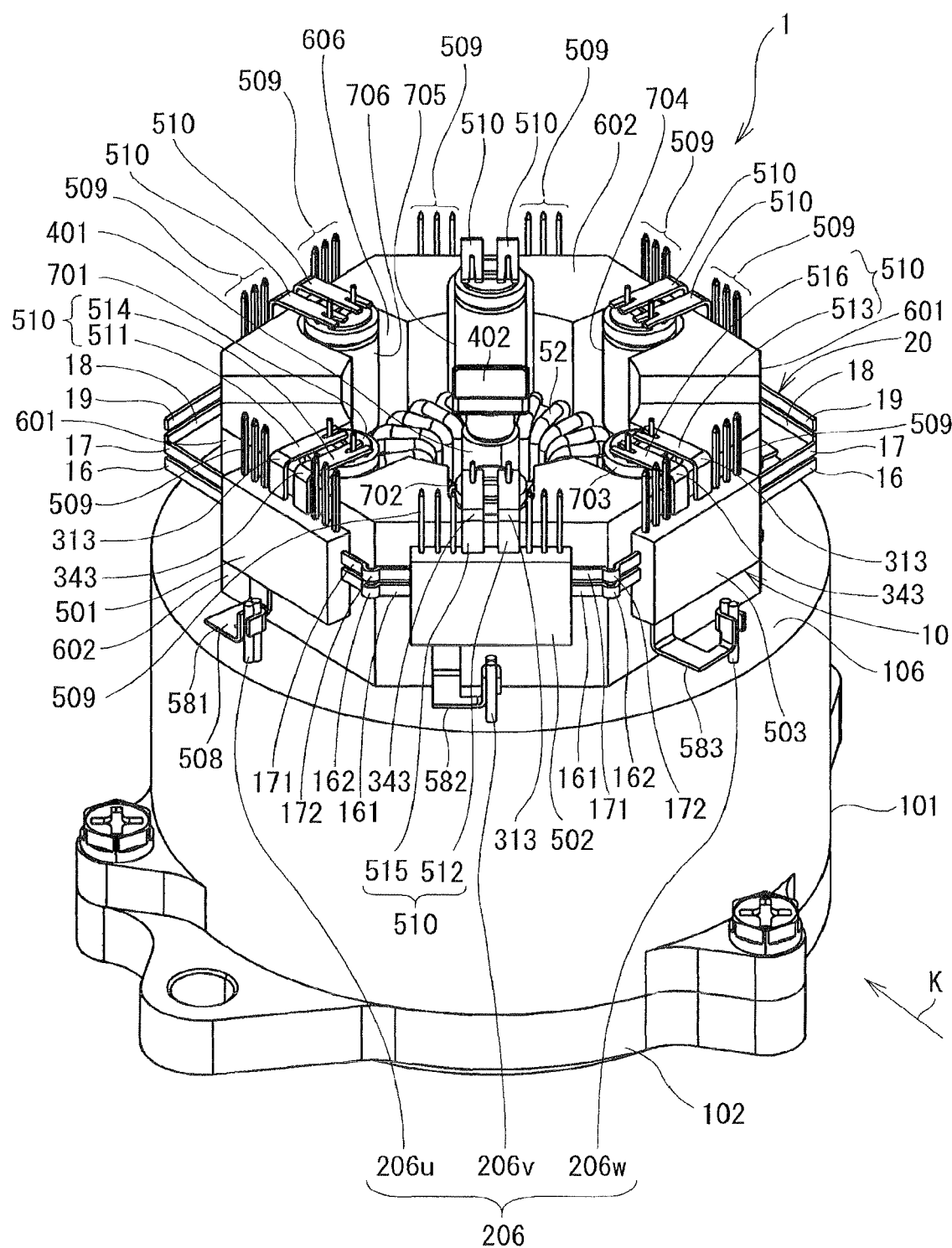
FIG. 10 is a perspective view showing the electronic circuit-integrated motor device that uses the linked semiconductor module unit according to the first embodiment.

As shown in FIG. 10, the semiconductor modules 501 to 506 are disposed on the sidewall surfaces 605, which face the radially outside part of the heat sink 601. If necessary, the semiconductor modules 501 to 506 will be individually referred to as a U1 semiconductor module 501, a V1 semiconductor module 502, a W1 semiconductor module 503, a U2 semiconductor module 504, a V2 semiconductor module 505, and a W2 semiconductor module 506. The semiconductor modules 501 to 503 of the first inverter circuit 60 are linked by a first bus bar 16 and a second bus bar 17 to form a first linked semiconductor module unit 10. The semiconductor modules 504 to 506 of the second inverter circuit 68 are linked by a first bus bar 18 and a second bus bar 19 to form a second linked semiconductor module unit 20. The semiconductor modules 501 to 506 include the coil terminals 508, control terminals 509 and capacitor terminals 510. The coil terminals 508 are for connection to the phase coils of the motor 30 and mounted on a bottom side wall surface 112 toward the motor case 101 in a protruding manner and bent toward the radially outside as shown in FIGS. 8 to 10. The control terminals 509, which are for connection to the control circuit 70, and the capacitor terminals 510, which are for connection to the capacitors 56 to 58, are mounted on a top side wall surface 111 opposite the motor case 101 in a protruding manner toward the cover 103 as shown in FIGS. 8 to 10. The linked semiconductor module units 10, 20 are formed by the semiconductor modules 501 to 506 as follows.

Figure 7:
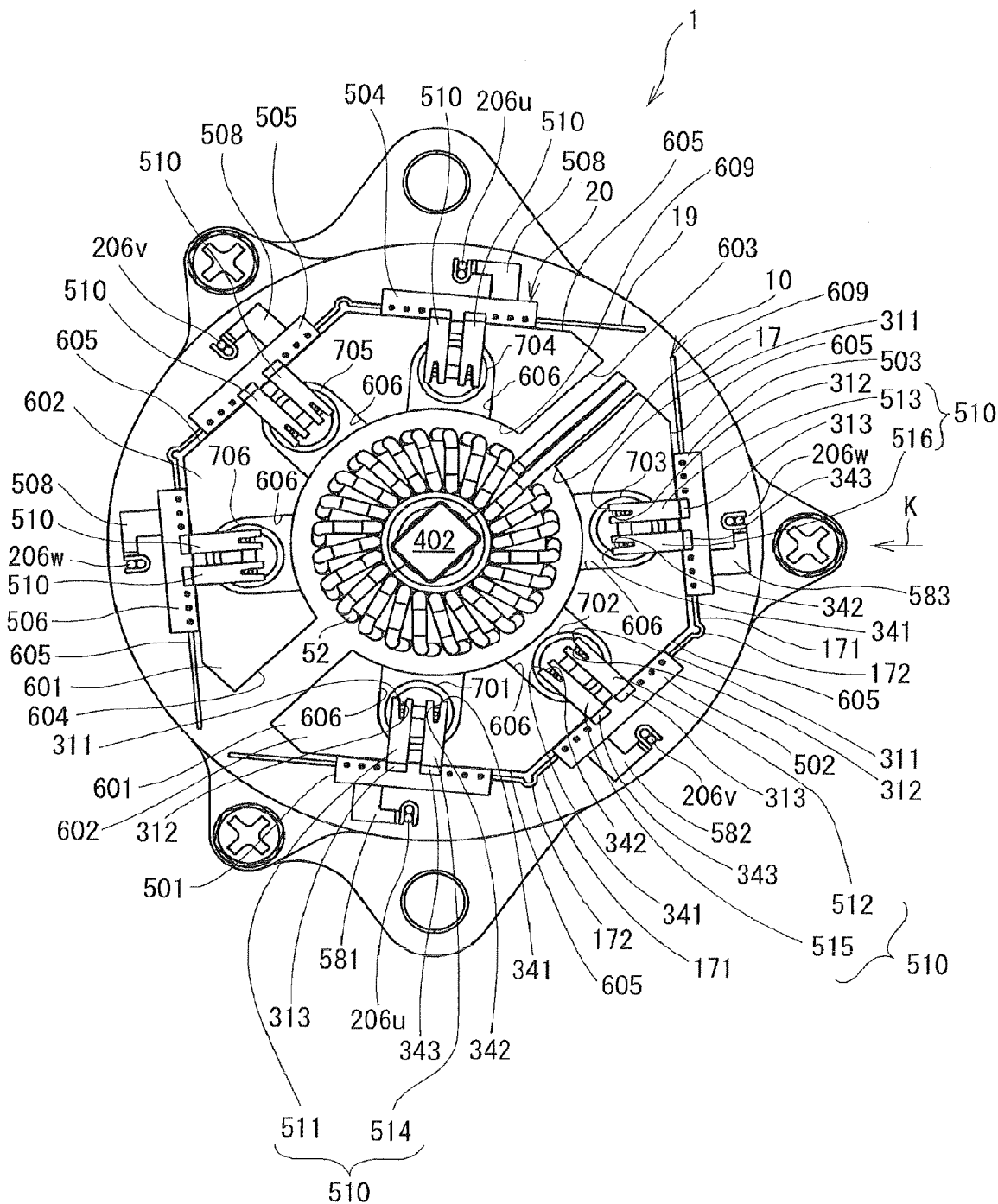
FIG. 7 is a top plan view showing an electronic circuit-integrated motor device that uses the linked semiconductor module unit according to the first embodiment.

The semiconductor modules 501 to 506 are mounted on the heat sink 601, which is mounted on the axial end of the motor case 101 in an axially raised or protruded manner. The semiconductor modules 501 to 506 are disposed, one by one, on the sidewall surfaces 605, which face the radially outside wall surfaces of the heat sink 601. The bus bars 16, 17 for the linked semiconductor module unit 10 are bent so that the linked semiconductor module unit 10 formed by the semiconductor modules 501 to 503 is positioned around the rotation axis of the motor 30 to surround the shaft 401 and the heat sink 601 in the circumferential direction as shown in FIGS. 7 and 10. Similarly, the bus bars 18, 19 for the linked semiconductor module unit 20 are bent so that the linked semiconductor module unit 20 formed by the semiconductor modules 504 to 506 is positioned around the rotation axis of the motor 30 to surround the shaft 401 and the heat sink 601. The semiconductor modules 501 to 506 are shaped like a thin wall plate in the form of a cuboid or a rectangular solid that is extended in the planar direction of a molded semiconductor chip. One of the six surfaces having a relatively large area, for example the largest area, serves as a heat dissipation surface.

A heat dissipation portion 569 is exposed from the heat dissipation surface. The semiconductor modules 501 to 506 are disposed in such a manner that the heat dissipation surface is in planar contact with the sidewall surfaces 605. In this instance, the sidewall surfaces 605 are plane surfaces. Accordingly, the heat dissipation surfaces of the semiconductor modules 501 to 506 are also plane surfaces. A heat dissipation insulation sheet (not shown) is placed between the semiconductor modules 501 to 506 and the heat sink 601 to provide electric insulation between the heat dissipation portion 569 and the heat sink 601. Even when the heat dissipation insulation sheet or other similar sheet-shaped member is placed between the semiconductor modules 501 to 506 and the heat sink 601 to provide an indirect contact, it is assumed that the semiconductor modules 501 to 506 are in planar contact with the heat sink 601.

As the semiconductor modules 501 to 506 are disposed on the sidewall surfaces 605 of the heat sink 601, the line perpendicular to a semiconductor chip surface is perpendicular to the central axis of the shaft 401. That is, the semiconductor modules 501 to 506 are perpendicularly disposed.

The accommodation sections 606 of the heat sink 601 house the capacitors 701, 702, 703, 704, 705, 706, respectively, as shown in FIG. 7. When necessary, the capacitors 701 to 706 will be individually referred to as a U1 capacitor 701, a V1 capacitor 702, a W1 capacitor 703, a U2 capacitor 704, a V2 capacitor 705, and a W2 capacitor 706. The capacitors 701 to 703 are provided for the first inverter circuit 60, whereas the capacitors 704 to 706 are provided for the second inverter circuit 68. The U1 capacitor 701 corresponds to the capacitor 56. The V1 capacitor 702 corresponds to the capacitor 57 shown in FIG. 6. The W1 capacitor 703 corresponds to the capacitor 58. As for the second inverter circuit 68, the U2 capacitor 704 is a U-phase capacitor, the V2 capacitor 705 is a V-phase capacitor, and the W2 capacitor 706 is a W-phase capacitor.

The capacitors 701 to 706 are housed in the accommodation sections 606 of the heat sink 601 and respectively positioned near the semiconductor modules 501 to 506, which are disposed in a radially inward direction, while the heat sink 601 is clamped between the capacitors 701 to 706 and the semiconductor modules 501 to 506. The capacitors 701 to 706 are cylindrical in shape and disposed in such a manner that their axes are parallel to the central axis of the shaft 401. Further, the capacitors 701 to 706, which are positioned outside a resin part 11, are directly connected to the capacitor terminals 510 of the semiconductor modules 501 to 506. More specifically, the U1 semiconductor module 501 is connected to the U1 capacitor 701, the V1 semiconductor module 502 is connected to the V1 capacitor 702, and the W1 semiconductor module 503 is connected to the W1 capacitor 703. In addition, the U2 semiconductor module 504 is connected to the U2 capacitor 704, the V2 semiconductor module 505 is connected to the V2 capacitor 705, and the W2 semiconductor module 506 is connected to the W2 capacitor 706.

The shaft 401 is protruded from the end wall 106 toward the electronic circuit section including the printed circuit board 801 as shown in FIG. 9. As shown, for instance, in FIG. 7, the choke coil 52 is disposed in such a manner that the shaft 401 is inserted through the choke coil 52. Thus, the choke coil 52 surrounds the shaft 401 circumferentially. The choke coil 52 is placed in a cylindrical space that is formed by the arc portion 609 formed at the radial center of the heat sink 601. The choke coil 52 is formed by winding a coil wire around a doughnut-shaped iron core. The coil ends of the choke coil 52 are passed between the cut surfaces 603 of the columnar members 602 and routed out in a radially outward direction.

The coil ends of the choke coil 52 are connected to the power supply cable in series as understood in FIG. 6.

The connections between the coil terminal 508 and the lead wire 206, the semiconductor modules 501 to 506, the heat sink 601, the capacitors 701 to 706, and the choke coil 52 are sequentially arranged in the order named within the outside diameter range of the motor case 101, in the radially inward direction from the radially outside to the radially inside, to make effective use of the radial space.

Meanwhile, the power circuit 50 and the control circuit 70 are obviously required to exercise drive control over the motor 30. The power circuit 50 and the control circuit 70 are configured to form an electronic control unit (ECU). The electronic circuit-integrated motor device 1 is characterized by the internal configuration of the ECU.

The motor 30 used for the EPS system generates an output of approximately 500 W to 2 kW. The physical space occupied by the power circuit 50 and the control circuit 70 is approximately 20 to 40% of the entire electronic circuit-integrated motor device 1. Further, as the motor 30 needs to generate a large output, the power circuit 50 tends to be large in size. Therefore, the power circuit 50 occupies more than 70% of the region occupied by the power circuit 50 and the control circuit 70.

Large parts forming the power circuit 50 are the choke coil 52, the capacitors 56 to 58, and the FETs 61 to 67.

First of all, the semiconductor modules 501 to 506 having the FETs 61 to 67 will be described. As shown in FIG. 6, the semiconductor modules 501 to 503 form the first inverter circuit 60, whereas the semiconductor modules 504 to 506 form the second inverter circuit 68. More specifically, the U1, V1, and W1 semiconductor modules 501 to 503 form the first inverter circuit 60, whereas the U2, V2, and W2 semiconductor modules 504 to 506 form the second inverter circuit 68. The U1 semiconductor module 501 includes the FETs 61, 64, which are for the U-phase. The V1 semiconductor module 502 includes the FETs 62, 65, which are for the V-phase. The W1 semiconductor module 503 includes the FETs 63, 66, which are for the W-phase, and the FET 67, which is for protection against reverse connection.

The linked semiconductor module unit 10 is formed as the first bus bar 16 and the second bus bar 17 link the semiconductor modules 501 to 503 having the FETs 61 to 67. In addition, the linked semiconductor module unit 20 is formed as the first bus bar 18 and the second bus bar 19 link the semiconductor modules 504 to 506 having the FETs 61 to 67.

As shown in FIGS. 7 to 11, the linked semiconductor module unit 10 is formed as the U1 semiconductor module 501, the V1 semiconductor module 502, and the W1 semiconductor module 503 are coupled by the first bus bar 16, which is a first conductive member, and the second bus bar 17, which is a second conductive member. Further, the linked semiconductor module unit 20 is formed as the U2 semiconductor module 504, the V2 semiconductor module 505, and the W2 semiconductor module 506 are coupled by the first bus bar 18, which is a first conductive member, and the second bus bar 19, which is a second conductive member. The first bus bars 16, 18 are connected to the power supply cable (positive polarity side of the power source 51), whereas the second bus bars 17, 19 are connected to the ground (negative polarity side of the power source 51). Therefore, electrical power is supplied to the semiconductor modules 501 to 506 through the bus bars 16 to 19. The bus bars 16 to 19 thus couple the semiconductor modules 501 to 506 not only mechanically, but electrically as well. The linked semiconductor module unit 10 forms the first inverter circuit 60 shown in FIG. 6, whereas the linked semiconductor module unit 20 forms the second inverter circuit 68 shown in FIG. 6. The electronic circuit-integrated motor device 1 includes the two inverter circuits 60, 68. This ensures that the currents flowing to the inverter circuits 60, 68 are each reduced to one half. It should also be noted that the bus bars 16 to 19 form a linking member.

Figure 1:
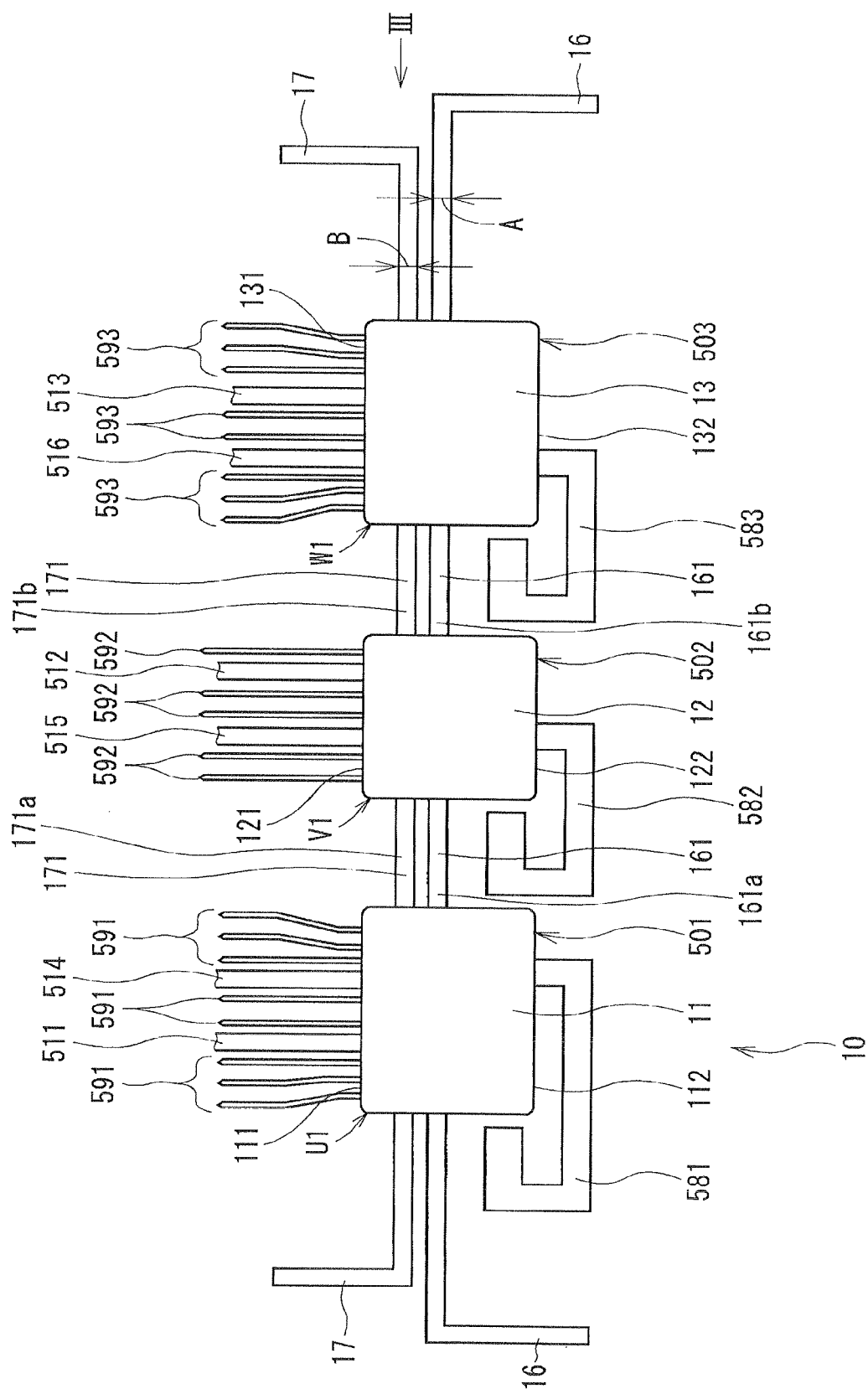
FIG. 1 is a plan view showing a linked semiconductor module unit according to the first embodiment of the present invention.
Figure 2:
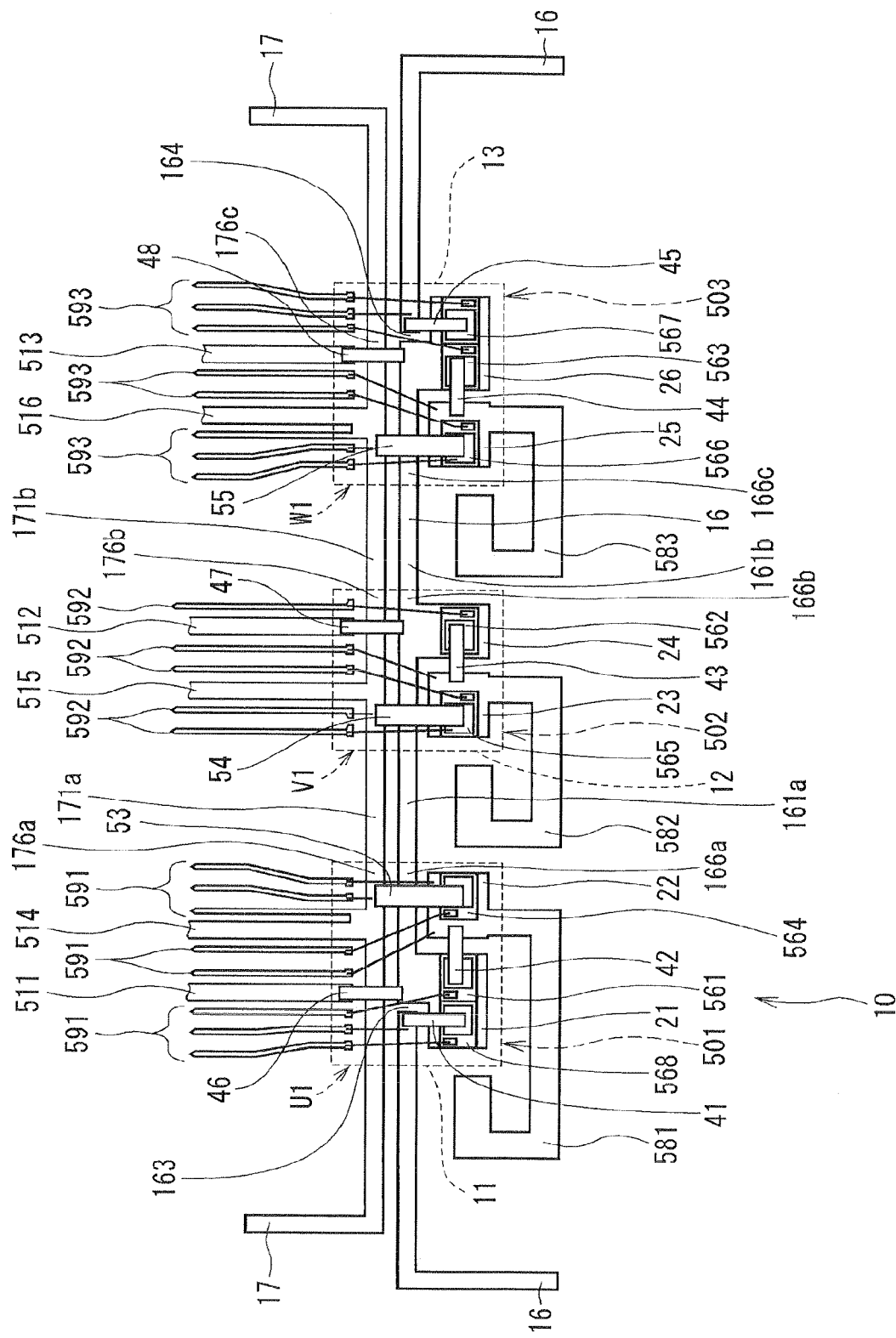
FIG. 2 is a plan view showing the linked semiconductor module unit according to the first embodiment with its resin parts removed.
Figure 12:
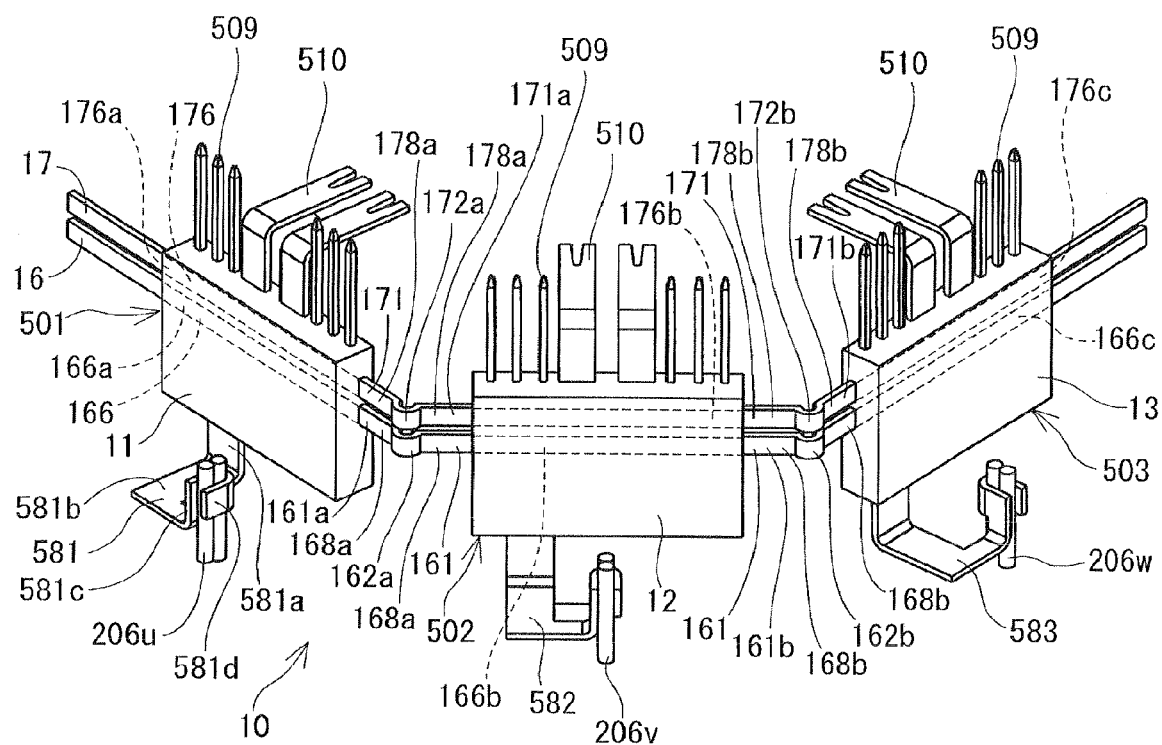
FIG. 12 is an enlarged perspective view showing the linked semiconductor module unit shown in FIG. 10.

The linked semiconductor module units 10, 20 have substantially the same structure. Therefore, the linked semiconductor module unit 10 will be mainly described with reference to FIGS. 1, 2, and 12. FIG. 1 shows the linked semiconductor module unit 10. FIG. 2 shows the linked semiconductor module unit 10 with its resin parts 11 to 13 removed. FIG. 12 shows the linked semiconductor module unit 10. The internal structures of the semiconductor modules are as shown in FIG. 2. In FIG. 12, however, embedded portions 166 are indicated by broken lines for the sake of simplicity.

As shown in FIGS. 1, 2, and 12, the first bus bar 16 and the second bus bar 17 are made of copper or other conductive metal and shaped like a thin flat plate or belt of 0.64 mm in thickness. Here, the term "thickness" denotes a width as measured in a direction perpendicular to the paper surface of FIG. 1. The thickness of the first bus bar 16 is less than the width of the first bus bar 16 that is indicated by the symbol A in FIG. 1. Similarly, the thickness of the second bus bar 17 is less than the width of the second bus bar 17 that is indicated by the symbol B in FIG. 1. The width of the first bus bar 16, which is indicated by the symbol A, is the same as that of the second bus bar 17, which is indicated by the symbol B. However, the width A of the first bus bar 16 may be different from that B of the second bus bar 17. When the linked semiconductor module unit 10 is oriented perpendicularly or perpendicularly to the radial direction of the shaft, that is, radially outside the heat sink 601 as shown in FIGS. 7 to 10, the radial width, which is the thickness of the first bus bar 16, is less than the axial width indicated by the symbol A in FIG. 1. Similarly, when the linked semiconductor module unit 10 is oriented perpendicularly as shown in FIGS. 7 to 10, the radial width, which is the thickness of the first bus bar 17, is less than the axial width indicated by the symbol B in FIG. 1.

The first bus bar 16 and the second bus bar 17 are embedded in the U1 resin part 11 of the U1 semiconductor module 501, the V1 resin part 12 of the V1 semiconductor module 502, and the W1 resin part 13 of the W1 semiconductor module 503.

The first bus bar 16 includes an embedded portion 166, which is embedded in the resin parts 11 to 13. The embedded portion 166 includes a U1 embedded portion 166a, which is embedded in the U1 resin part 11; a V1 embedded portion 166b, which is embedded in the V1 resin part 12; and a W1 embedded portion 166c, which is embedded in the W1 resin part 13. The first bus bar 16 includes an exposed portion 161, which is not embedded in the resin parts 11 to 13 of the semiconductor modules 501 to 503. The exposed portion 161 includes a UV exposed portion 161a, which is positioned between the U1 embedded portion 166a and the V1 embedded portion 166b; and a VW exposed portion 161b, which is positioned between the V1 embedded portion 166b and the W1 embedded portion 166c. The U1 embedded portion 166a, the UV exposed portion 161a, the V1 embedded portion 166b, the VW exposed portion 161b, and the W1 embedded portion 166c are arranged in the order named and formed integrally in a continuous manner.

Figure 11:
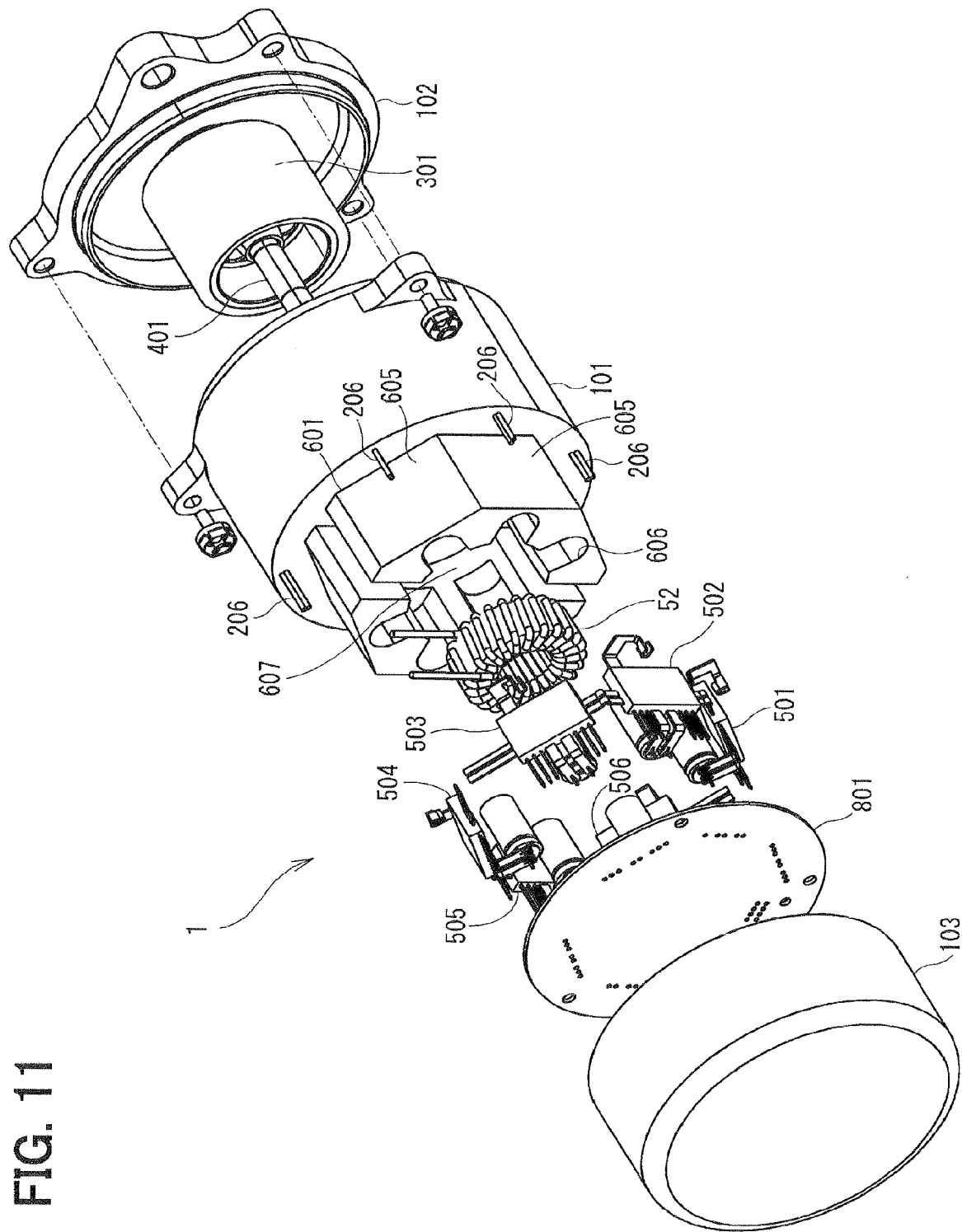
FIG. 11 is an exploded perspective view showing the electronic circuit-integrated motor device that uses the linked semiconductor module unit according to the first embodiment.

As shown in FIG. 12, the exposed portion 161 includes a linear portion 168 and a curved portion 162. The UV exposed portion 161a includes a linear portion 168a and a curved portion 162a that is a circular bulge formed on the linear portion 168a. The VW exposed portion 161b includes a linear portion 168b and a curved portion 162b that is a circular bulge formed on the linear portion 168b. The first bus bar 16 is bent at the curved portions 162a, 162b (FIGS. 7, 10, and 11). In the first bus bar 16, the curved portions 162a, 162b form a bent portion, which is bulged in the radially outward direction.

Similarly, the second bus bar 17 includes an embedded portion 176, which is embedded in the resin parts 11 to 13. The embedded portion 176 includes a U1 embedded portion 176a, which is embedded in the U1 resin part 11; a V1 embedded portion 176b, which is embedded in the V1 resin part 12; and a W1 embedded portion 176c, which is embedded in the W1 resin part 13. The second bus bar 17 includes an exposed portion 171, which is not embedded in the resin parts 11 to 13 of the semiconductor modules 501 to 503. The exposed portion 171 includes a UV exposed portion 171a, which is positioned between the U1 embedded portion 176a and the V1 embedded portion 176b; and a VW exposed portion 171b, which is positioned between the V1 embedded portion 176b and the W1 embedded portion 176c. The U1 embedded portion 176a, the UV exposed portion 171a, the V1 embedded portion 176b, the VW exposed portion 171b, and the W1 embedded portion 176c are arranged in the order named and formed integrally in a continuous manner.

As shown in FIG. 12, the exposed portion 171 includes a linear portion 178 and a curved portion 172. The UV exposed portion 171a includes a linear portion 178a and a curved portion 172a that is a circular bulge formed on the linear portion 178a. The VW exposed portion 171b includes a linear portion 178b and a curved portion 172b that is a circular bulge formed on the linear portion 178b. The second bus bar 17 is bent at the curved portions 172a, 172b. In the second bus bar 17, the curved portions 172a, 172b form a bent portion, which is bulged in the radially outward direction.

The linked semiconductor module unit 10 can be bent at the curved portions 162, 172 of the exposed portions 161, 171 of the first and second bus bars 16, 17. As shown in FIGS. 7 and 10, the semiconductor modules 501 to 503 are disposed in planar contact with the sidewall surfaces 605 of the heat sink 601 on the radially outside part of the heat sink 601 so that the coil terminals 508 are positioned toward the motor 30. This promotes the dissipation of heat. Further, as the curved portions 162, 172 shaped like an arc are formed on the exposed portions 161, 171, it is possible to avoid bend-induced stress concentration, thereby preventing the resin parts 11 to 13 from being damaged.

The U1 semiconductor module 501 includes a first terminal 511, a second terminal 514, and a control terminal 591, which are mounted in a protruding manner on the top side wall surface 111 of the resin part 11 that is positioned toward the printed circuit board 801 (for instance, FIG. 9). The V1 semiconductor module 502 includes a first terminal 512, a second terminal 515, and a control terminal 592, which are mounted in a protruding manner on a top side wall surface 121 of the resin part 12 that is positioned toward the printed circuit board 801 to face the printed circuit board 801. The W1 semiconductor module 503 includes a first terminal 513, a second terminal 516, and a control terminal 593, which are mounted in a protruding manner on a top side wall surface 131 of the resin part 13 that is positioned toward the printed circuit board 801.

Further, the U1 semiconductor module 501 includes a coil terminal 581, which is mounted substantially perpendicularly in a protruding manner on the bottom side wall surface 112 of the resin part 11 that is positioned toward the motor case 101 (see, for instance, FIG. 10). The V1 semiconductor module 502 includes a coil terminal 582, which is mounted substantially perpendicularly in a protruding manner on a bottom side wall surface 122 of the resin part 12 that is positioned toward the motor case 101 to face the axial end wall 106. The W1 semiconductor module 503 includes a coil terminal 583, which is mounted substantially perpendicularly in a protruding manner on a bottom side wall surface 132 of the resin part 13 that is positioned toward the motor case 101. The coil terminals 581 to 583 are displaced from the centers of the side wall surfaces 112, 122, 132 in the direction of the length of the linked semiconductor module unit 10. In the example shown in FIG. 1, the coil terminals 581 to 583 are bent substantially perpendicularly in the downward, leftward, upward, and rightward directions relative to the paper surface of FIG. 1. The waste of a lead frame 15 can thus be reduced by bending the coil terminals 581 to 583.

When perpendicularly disposed in the electronic circuit-integrated motor device 3, the coil terminals 581 to 583 are bent to support the lead wire 206 of the coil 205 by clamping them as shown in FIGS. 7 to 12. The coil terminals 581 to 583 are bent in substantially the same manner. Therefore, the coil terminal 581 will now be described in detail with reference to FIG. 12.

The coil terminal 581 includes a droop portion 581a, an intermediate portion 581b, a rise portion 581c, and a clamp (sandwich) portion 581d. The droop portion 581a, intermediate portion 581b, rise portion 581c, and clamp portion 581d are formed integrally and bent. The droop portion 581a is mounted substantially perpendicularly in a protruding manner on the bottom side wall surface 112 toward the motor case 101, which is perpendicular to the surfaces of semiconductor chips 561, 565, 568 (FIG. 2). Further, the droop portion 581a is displaced from the center of the bottom side wall surface 112 in the direction of the width (in a lateral direction relative to the paper surface of FIG. 1). The intermediate portion 581b is bent in the thickness direction of the U1 resin part 11 from the droop portion 581a. The intermediate portion 581b is bent into an L-shaped form that is extended circumferentially from the radially outside. The rise portion 581c is raised upward and away from the end wall 106 of the motor case 101. The rise portion 581c and the droop portion 581a are displaced from each other in the direction of the width of the U1 resin part 11. The clamp portion 581d is formed at the leading end of the rise portion 583 and bent into a U-shaped form open to the radially outside so as to clamp a lead wire 206u for the coil 205, which is routed out of a hole in the axial end wall 106 of the motor case 101.

Consequently, the coil terminal 581, which is connected to the junction between the FETs 61 and 64, establishes an electrical connection by clamping the U-phase lead wire 206u, which is routed out of the hole in the axial end wall 106 of the motor case 101. Thus, the U1 semiconductor module 501 is connected to the U-phase of the coil 205 for the purpose of turning on or off a U-phase coil current. Similarly, the coil terminal 582, which is connected to the junction between the FETs 62 and 65, establishes an electrical connection by clamping a V-phase lead wire 206v, which is routed out of the hole in the axial end wall 106 of the motor case 101. Thus, the V1 semiconductor module 502 is connected to the V-phase of the coil 205 for the purpose of turning on or off a V-phase coil current. Further, the coil terminal 583, which is connected to the junction between the FETs 63 and 66, establishes an electrical connection by clamping a W-phase lead wire 206w, which is routed out of the hole in the axial end wall 106 of the motor case 101. Thus, the W1 semiconductor module 503 is connected to the W-phase of the coil 205 for the purpose of turning on or off a W-phase coil current. The lead wires 206u, 206v, 206w form the lead wire 206.

The coil terminals 581 to 583 form the coil terminals 508. The control terminals 591 to 593 form the control terminals 509. The first terminals 511 to 513 and the second terminals 514 to 516 form the capacitor terminals 510.

As shown in FIGS. 7 and 10, the linked semiconductor module unit 10 is oriented so that the side wall surfaces 112, 122, 132 are positioned toward the motor 30 with the side wall surfaces 111, 121, 122 positioned toward the printed circuit board 801, that is, opposite the motor 30. When the linked semiconductor module unit 10 is disposed in the electronic circuit-integrated motor device 1, the side wall surfaces 111, 112, 121, 122, 131, 132 are substantially parallel to the end wall 106 of the motor case 101. The first terminals 511 to 513 are bent at a bent portion 313 and in a radially inward direction along the heat sink 601 (in a rearward direction relative to the paper surface of FIGS. 1 and 2). Cut portions 312, which are cut into a U-shaped form, are formed on the leading ends 311 of the first terminals 511 to 513, and directly connected to the positive terminals of the capacitors 701 to 703.

The second terminals 514 to 516 are bent at a bent portion 343 and in a radially inward direction along the heat sink 601 (in a rearward direction relative to the paper surface of FIGS. 1 and 2). Cut portions 342, which are cut into a U-shaped form, are formed on the leading ends 341 of the second terminals 514 to 516, and directly connected to the negative terminals of the capacitors 701 to 703.

The control terminals 591 to 593 are passed through through-holes in the printed circuit board 801 (FIGS. 9 and 11), which forms the control circuit 70, and soldered thereto. The semiconductor modules 501 to 503 are then electrically connected to the control circuit 70 (FIG. 6). The control terminal 592 is sized longer than the control terminals 591 and 593. Thus, the U1 semiconductor module 501 and the W1 semiconductor module 503 can be positioned after the control terminal 592 of the V1 semiconductor module 502, which is formed in the middle, is passed through a through-hole in the printed circuit board 801 for positioning purposes.

The internal structure of the linked semiconductor module unit 10 will now be described with reference to FIG. 2, which illustrates the linked semiconductor module unit 10 shown in FIG. 1 with its resin parts 11 to 13 removed.

The U1 semiconductor module 501 includes lands 21, 22. The land 21 is formed integrally with the first bus bar 16, and two semiconductor chips 561 to 568 are mounted on the land 21. The semiconductor chip 561 includes the FET (Su+) 61 (FIG. 1) and is electrically connected to the land 22 with a wire 42 by means of wire bonding. The semiconductor chip 568 is configured so that the FET 67, which provides protection against reverse connection, can be mounted on it, and electrically connected to the first bus bar 16 with a wire 41 by means of wire bonding. A gap 163 is provided between a portion of the first bus bar 16 that is contiguous to the land 21 and a portion of the first bus bar 16 that is wire-bonded to the semiconductor chip 568; therefore, these two portions are not contiguous to each other. The land 22 is formed integrally with the coil terminal 581, and a semiconductor chip 564 is mounted on the land 22. The semiconductor chip 564 includes the FET (Su−) 64 and is electrically connected to the second bus bar 17 through the shunt resistor 53.

The V1 semiconductor module 502 includes lands 23, 24. The land 23 is formed integrally with the coil terminal 582, and the semiconductor chip 565 is mounted on the land 23. The semiconductor chip 565 includes the FET (Sv−) 65 and is electrically connected to the second bus bar 17 through the shunt resistor 54. The land 24 is formed integrally with the first bus bar 16, and a semiconductor chip 562 is mounted on the land 24. The semiconductor chip 562 includes the FET (Sv+) 62 and is electrically connected to the land 23 with a wire 43 by means of wire bonding.

The W1 semiconductor module 503 includes lands 25, 26. The land 25 is formed integrally with the coil terminal 583, and a semiconductor chip 566 is mounted on the land 25. The semiconductor chip 566 includes the FET (Sw−) 66 and is electrically connected to the second bus bar 17 through the shunt resistor 55. The land 26 is formed integrally with the first bus bar 16, and two semiconductor chips 563, 567 are mounted on the land 26. The semiconductor chip 563 includes the FET (Sw+) 63 and is electrically connected to the land 25 with a wire 44 by means of wire bonding. The semiconductor chip 567 is configured so that the FET 67, which provides protection against reverse connection, can be mounted on it, and electrically connected to the first bus bar 16 with a wire 45 by means of wire bonding. A gap 164 is provided between a portion of the first bus bar 16 that is contiguous to the land 26 and a portion of the first bus bar 16 that is wire-bonded to the semiconductor chip 567; therefore, these two portions are not contiguous to each other.

The semiconductor chips 567, 568 are both configured so that the FET 67, which provides protection against reverse connection, may be mounted on them. However, the FET 67 is mounted on either of the above two semiconductor chips 567, 568. In the present embodiment, the FET 67 is mounted on the semiconductor chip 568 of the linked semiconductor module unit 10, and the FET 67 is mounted on the semiconductor chip 567 of the linked semiconductor module unit 20. More specifically, the FET 67 is mounted on the W1 semiconductor module 503 and U2 semiconductor module 504 as shown in FIGS. 7 and 10.

The base ends of the first terminals 511 to 513 are electrically connected to the first bus bar 16 with wires 46 to 48 by means of wire bonding. The base ends of the second terminals 514 to 516 are formed integrally with the second bus bar 17.

The base ends of the control terminals 591 to 593 are connected, for instance, to the first bus bar 16, the second bus bar 17, the lands 22, 23, 25, and the gates and sources of the semiconductor chips 561 to 568 by means of wire bonding.

Figure 3:
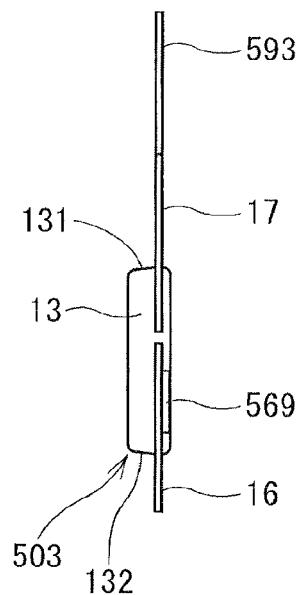
FIG. 3 is a side view showing the linked semiconductor module unit viewed in the direction III in FIG. 1.

Further, the heat dissipation portion 569, which protrudes in a direction opposite to that of a surface on which the semiconductor chips 563, 567 are mounted, is formed on the W1 semiconductor module 503 as shown in FIG. 3. The heat dissipation portion 569 is formed integrally with the land 26 by means of press forming, and exposed from the resin part 13. This brings the heat dissipation portion 569, which is made of metal, into contact with the heat sink 601, thereby promoting the dissipation of heat through the thin insulation sheet (not shown). The heat dissipation portion 569, which protrudes in the direction opposite to that of the surface, on which the semiconductor chips are mounted, and is exposed from the resin part, is formed on all the lands 21 to 26.

The resin parts 11 to 13 are substantially in the form of a rectangular parallelepiped. They encapsulate the semiconductor chips 561 to 568 and embed the lands 21 to 26. As described above, the heat dissipation portions 569 formed on the lands 21 to 26 are exposed from the resin parts 11 to 13 and used to promote the dissipation of heat as they are brought into planar contact with the heat sink 601 through the heat dissipation insulation sheet (not shown).

Figure 5:
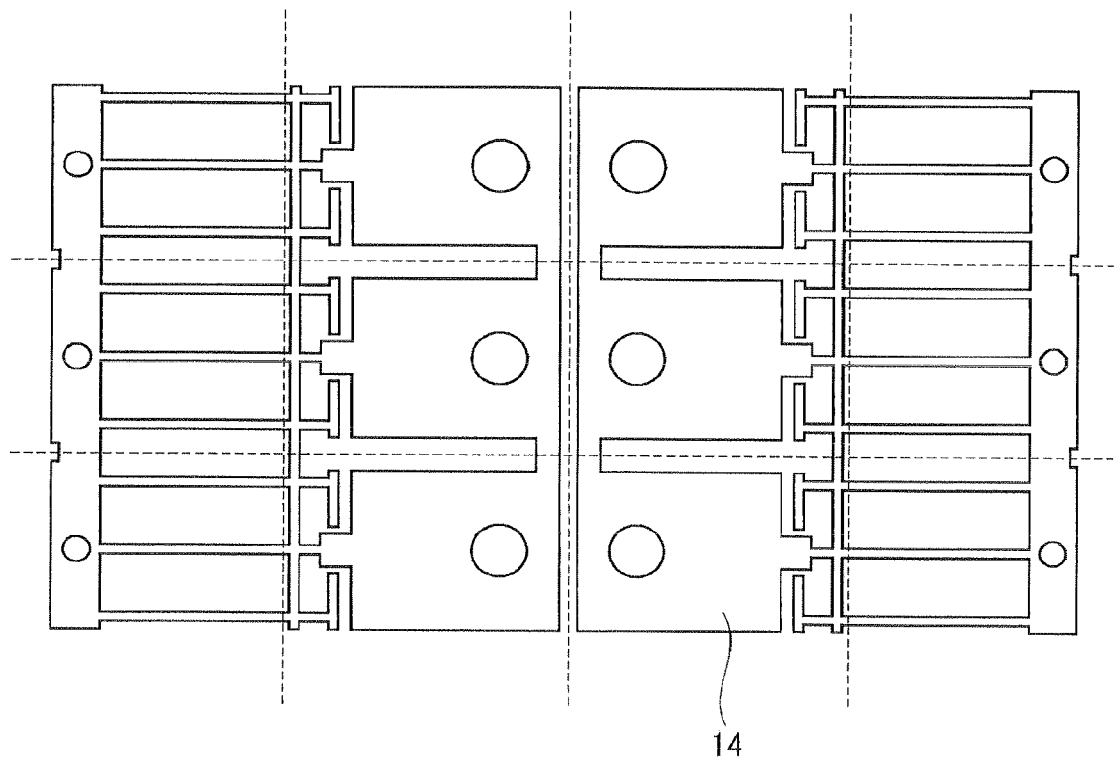
FIG. 5 is a schematic diagram showing a conventional semiconductor module manufacturing method.

Meanwhile, the use of a conventional semiconductor module manufacturing method often wastes materials and processes because, as schematically shown in FIG. 5, the conventional method first resin-molds the lead frame 14, then separates it into plural pieces for individual semiconductor modules as indicated by the broken lines, and connects the separated pieces with a printed circuit board or other member.

Figure 4:
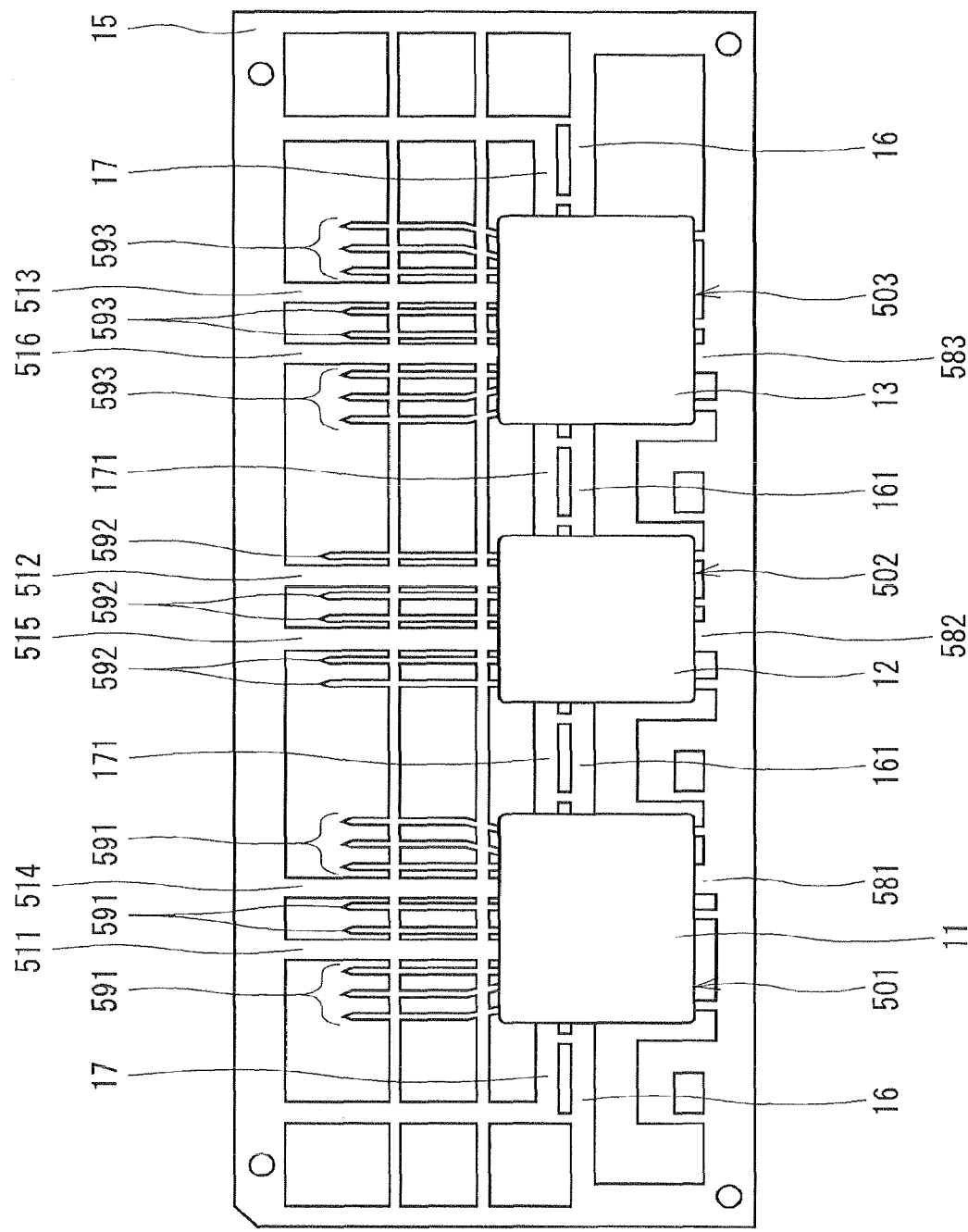
FIG. 4 is a plan view showing the linked semiconductor module unit according to the first embodiment in an intermediate state of manufacture.

According to the method of manufacturing the linked semiconductor module unit 10 of the present embodiment, as shown in FIG. 4, the first bus bar 16, the second bus bar 17, the lands 21 to 26 (not shown in FIG. 4, but shown FIG. 2), the first and second terminals 511 to 516 which are capacitor terminals, the control terminals 591 to 593, and the coil terminals 581 to 583 of the linked semiconductor module unit 10 are formed from one lead frame 15. The semiconductor chips 561 to 568 are mounted on the lands 21 to 26 formed on the lead frame 15. The semiconductor chips 561 to 568 are then electrically connected by means, for instance, of wire bonding. Subsequently, the semiconductor modules 501 to 503 are individually molded with the resin parts 11 to 13. Finally, unnecessary portions of the lead frame 15 are cut off to form the linked semiconductor module unit 10 shown in FIG. 1.

The first bus bar 16 and the second bus bar 17 are formed from the same lead frame 15 as for the lands 21 to 26 and other parts, and used to connect the semiconductor modules 501 to 503 both mechanically and electrically. This makes it possible to reduce the number of members to be cut off after molding with the resin parts 11 to 13. Further, it is not necessary to use a printed circuit board or other member to connect the semiconductor modules 501 to 503. This makes it possible to reduce the waste of materials and perform a simplified process.

As described above, the linked semiconductor module unit 10 according to the present embodiment links the three semiconductor modules 501 to 503 by embedding the first bus bar 16 and the second bus bar 17 in the resin parts 11 to 13. Therefore, there is no need to use a printed circuit board for the purpose of linking the semiconductor modules 501 to 503. Consequently, the linked semiconductor module unit 10 can be disposed in a place other than on a printed circuit board. It means that the linked semiconductor module unit can be disposed in a desired place without regard to the location of the printed circuit board.

The dissipation of heat can be promoted, because the linked semiconductor module units 10, 20 are configured so that the semiconductor modules 501 to 506 are disposed on the sidewall surfaces 605 to face the radially outside part of the heat sink 601, which is provided integrally from the axial end wall 106 of the motor case 101 in an axially protruded manner.

Further, the first bus bar 16 is configured so that the embedded portions 166 and the exposed portions 161 formed between the embedded portions are formed integrally in a continuous manner with the embedded portions 166 embedded in the resin parts 11 to 13. Similarly, the second bus bar 17 is configured so that the embedded portions 176 and the exposed portions 171 formed between the embedded portions are formed integrally in a continuous manner with the embedded portions 176 embedded in the resin parts 11 to 13. Consequently, a semiconductor module linking structure can be implemented with ease when the resin parts 11 to 13 are formed by molding the semiconductor chips 561 to 568, the lands 21 to 26, and the embedded portions 166, 176 of the first and second bus bars 16, 17.

Furthermore, the first and second bus bars 16, 17 include the exposed portions 161, 171, which are not molded in the resin parts 11 to 13, and can be bent at the exposed portions 161, 171. This makes it easy to dispose the semiconductor modules 501 to 503 at desired places. This configuration promotes the dissipation of heat because the exposed portions 161, 171 are bent so that all the semiconductor modules are brought into contact with the heat sink 601.

The exposed portions 161, 171 include the curved portions 162, 172, which are shaped like an arc. This makes it possible to prevent stress concentration from occurring when the first bus bar 16 or the second bus bar 17 is bent, thereby avoiding damage to the resin parts 11 to 13.

Moreover, the first and second bus bars 16, 17 are capable of supplying electrical power to the semiconductor chips 561 to 568. The first and second bus bars 16, 17 not only link the semiconductor modules 501 to 503 mechanically but also connect them electrically. The first and second bus bars 16, 17 are not limited to the thickness of the copper foil on a printed circuit board as they were in the past, but can be of any size or thickness appropriate for a demanded electrical conduction amount. The he semiconductor chips 561 to 566 include the FETs 61 to 66 that change the coil current flowing to the three-phase coil 205 for driving the electronic circuit-integrated motor device 1. The linked semiconductor module unit 10 needs to be capable of allowing a large current to flow. The first and second bus bars 16, 17 are 0.64 mm in thickness. They are thicker than the copper foil of a normal printed circuit board. Thus, their width can be reduced. This makes it possible to reduce the overall size of the linked semiconductor module unit 10. In addition, the printed circuit board 801 includes the control circuit 70 but not the inverter circuits 60, 68 of the power circuit 50. The size of the printed circuit board 801 can be reduced because it can be configured to permit the flow of only a relatively small current, which is adequate for driving the control circuit 70, without regard to the amount of electrical power supplied to the linked semiconductor module unit 10.

The first bus bar 16 is connected to the power source, whereas the second bus bar 17 is connected to the ground. This eliminates the need of installing additional electrical wires for connecting to the power source 51 and ground. Consequently, the number of parts can be reduced to create a simplified configuration.

The first and second bus bars 16, 17 are formed from the same lead frame 15 as for the lands 21 to 26. Consequently, processing can be achieved with ease because the first bus bar 16, the second bus bar 17, and the lands 21 to 26 are formed with one member. Further, as a portion that is usually removed after resin molding is utilized to form the first and second bus bars 16, 17, it is possible to reduce the waste of lead frame material.

The first and second bus bars 16, 17 are positioned substantially parallel to the surfaces of the semiconductor chips 561 to 568. The first and second bus bars 16, 17 are formed substantially parallel to the semiconductor chips 561 to 568 because the semiconductor chips 561 to 568 are mounted on the lands 21 to 26, which are formed integrally with the first and second bus bars 16, 17. Consequently, processing can be achieved with ease.

The first and second bus bars 16, 17 protrude from two opposing surfaces of the semiconductor modules 501 to 503 and dispose the semiconductor modules 501 to 503 in a linear fashion.

The semiconductor modules 501 to 503 are formed in the same plane during a forming process. Therefore, the semiconductor modules 501 to 503 can easily be formed on a plane surface.

Further, the semiconductor modules 501 to 503 are positioned on different plane surfaces in such a manner that the first and second bus bars 16, 17 are bent at the curved portion 162 of the exposed portion 161 and at the curved portion 172 of the exposed portion 171 and brought into contact with the heat sink 601. The semiconductor modules 501 to 503, which are linked by the first and second bus bars 16, 17 to form the linked semiconductor module unit 10, are disposed three-dimensionally. Thus, manufacture processing is performed on a plane surface, on which processing can be achieved with ease, and then the first and second bus bars 16, 17 are bent to dispose the semiconductor modules 501 to 503 at desired positions.

The lands 21 to 26 protrude in a direction opposite to that of a mounting surface on which the semiconductor chips 561 to 568 are mounted, and include the heat dissipation portion 569, which is exposed from the resin parts 11 to 13. The dissipation of heat can be promoted because the heat dissipation portion 569 is in planar contact with the heat sink 601.

The semiconductor chips 561 to 566 include the switching FETs 61 to 66 that change the coil current flowing to a multiple-phase coil for driving the motor 30, that is, the three-phase coil 205 in the present embodiment. The first and second bus bars 16, 17 are configured to be capable of supplying an electrical current to the semiconductor modules 501 to 503. This makes it possible to reduce the size of the linked semiconductor module unit 10, which conducts a relatively large coil current. Further, the printed circuit board 801, which includes the control circuit 70 for controlling, for instance, the timing of switching, does not need to conduct the coil current. Thus, the printed circuit board 801 can be configured to be capable of conducting only a relatively small current for driving the control circuit 70. Therefore, the printed circuit board 801 can be sized small. This makes it possible to reduce the overall size of the electronic circuit-integrated motor device 1. The printed circuit board 801 is housed within the cover 103 that has substantially the same diameter as the motor case 101. Consequently, the radial physical size need not be enlarged.

The linked semiconductor module unit 10 is used for the electronic circuit-integrated motor device 1. The motor 30 includes the tubular motor case 101, which forms a shell; the stator 32, which is positioned on the radially inside part of the motor case 101 and wound with the three-phase coil 205; the rotor 33, which is positioned on the radially inside part of the stator 32; and the shaft 401, which rotates together with the rotor 33. The semiconductor modules 501 to 506 are disposed within the range of axial projection of the motor case 101, that is, within the diametric range of the motor case 101. Further, the semiconductor modules 501 to 503 are perpendicularly disposed so that the lines perpendicular to the surfaces of the semiconductor chips 561 to 568 are not parallel to the central axis of the shaft 401.

The linked semiconductor module unit 10 is perpendicularly disposed within a motor silhouette that is formed by virtually extending the motor case 101 in the axial direction. It means that the semiconductor modules are disposed in such a manner that they are axially raised. More specifically, the semiconductor modules 501 to 503 forming the linked semiconductor module unit 10 are perpendicularly disposed within the axial projection range of the motor case 101. This makes it possible to reduce the radial physical size of the motor 30. Particularly, the radial widths (thicknesses) of the bus bars 16 to 19 are less than the axial widths A, B thereof, in case the linked semiconductor module units 10, 20 are perpendicularly disposed. This will further increase the space in the radial direction.

The linked semiconductor module unit 20 has substantially the same configuration and produces the same advantages as the linked semiconductor module unit 10.

The electronic circuit-integrated motor device 1 using the linked semiconductor module units 10, 20 provides the following advantages.

(1) In the electronic circuit-integrated motor device 1, the semiconductor modules 501 to 506 are disposed in the direction of the central axis of the shaft 401 relative to the end wall 106 of the motor case 101. This makes it possible to reduce the physical size in the radial direction of the motor case 101. Further, the semiconductor modules 501 to 506 are perpendicularly arranged to bring them into planar contact with the sidewall surfaces 605 of the heat sink 601. Furthermore, the heat sink 601 includes the accommodation sections 606 in which the six capacitors 701 to 706 are disposed on the radially outside part to surround the shaft 401 and the choke coil 52. The heat sink 601 and capacitors 701 to 706 are disposed in the radially inward direction of the six semiconductor modules 501 to 506. Unlike a conventional configuration, the above-described configuration makes it possible to reduce the axial physical size as well. As a result, the physical size of the electronic circuit-integrated motor device 1 can be minimized.

Figure 13:
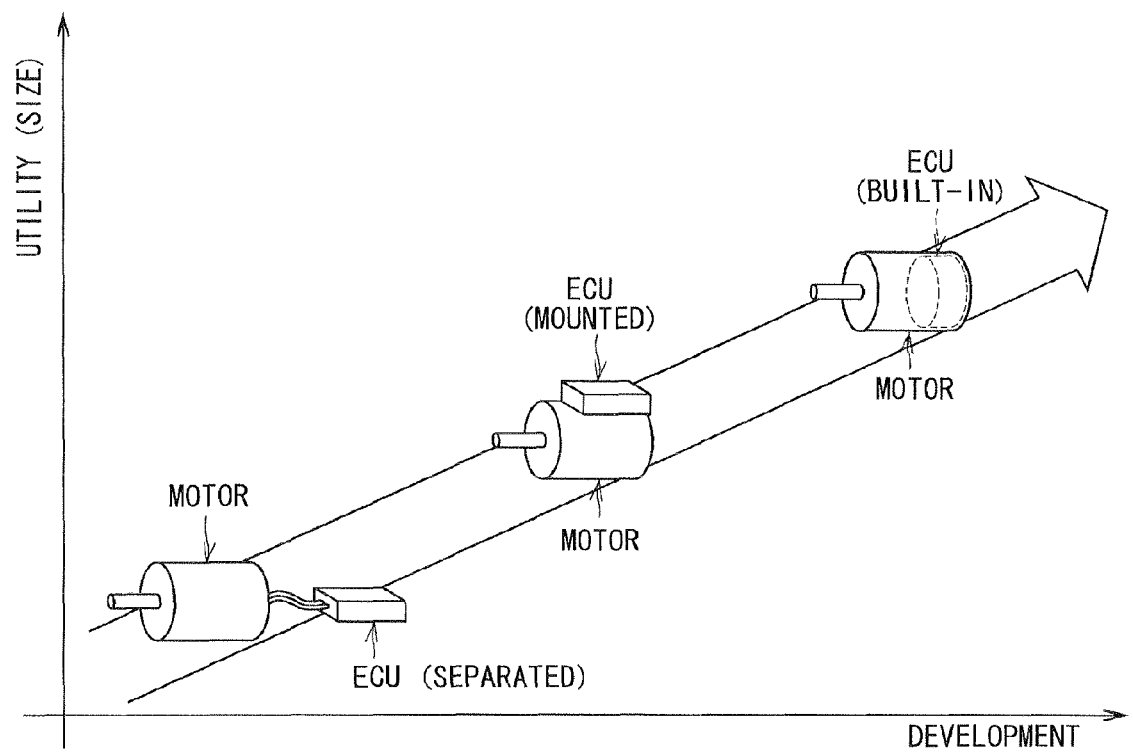
FIG. 13 is a diagram showing the history of development of a motor device with a built-in ECU.

The motor for an EPS system has evolved as shown in FIG. 13. Initially, a "separated" configuration was employed so that the motor was separate from the ECU. Then, a "mounted" configuration was frequently employed so that no wiring connections were needed. However, the "mounted" configuration was such that the ECU is housed in a case shaped like a rectangular parallelepiped and mounted outside a motor case. Next, a "built-in" configuration was employed so that the ECU was contained within a motor silhouette wherever possible. However, the use of the "built-in" configuration increased the axial physical size. As for the electronic circuit-integrated motor device 1, however, the semiconductor modules 501 to 506 are perpendicularly disposed. In addition, the space created by the use of such a configuration is utilized to improve the positional relationship to the capacitors 701 to 706. That is, the electronic circuit-integrated motor device 1 is implemented by improving the positional relationship between various parts. The electronic circuit-integrated motor device 1 employs an "integrated" configuration, which is superior to the "built-in" configuration.

(2) In the electronic circuit-integrated motor device 1, the lines perpendicular to the semiconductor chip surfaces of the semiconductor modules 501 to 506 are perpendicular to the central axis of the shaft 401. This will further increase the space around the shaft 401 in the radial direction.

(3) In the electronic circuit-integrated motor device 1, the capacitors 701 to 706 are disposed near the semiconductor modules 501 to 506 to face each other in the radial direction at generally the same axial position from the end wall 106. Further, the semiconductor modules 501 to 506 include the capacitor terminals 510, which are dedicated to the capacitors. The terminals of the capacitors 701 to 706 are directly connected to the capacitor terminals 510 and not routed through the printed circuit board 801. When this connection scheme is employed, the wiring between the semiconductor modules 501 to 506 and the capacitors 701 to 706 can be significantly shorter than when the semiconductor modules 501 to 506 are connected to the capacitors 701 to 706 through the printed circuit board 801. This permits the capacitors 701 to 706 to fully exercise their functions. In addition, the capacitors 701 to 706 are disposed for the semiconductor modules 501 to 506 on a one-to-one basis. This makes it possible to relatively decrease the capacitances of the capacitors 701 to 706 and reduce the physical sizes of the capacitors 701 to 706.

(4) The electronic circuit-integrated motor device 1 includes the heat sink 601, which is mounted on the end wall 106 of the motor case 101 in a standing manner and oriented in the direction of the central axis of the shaft 401. The semiconductor modules 501 to 506 are disposed on the sidewall surfaces 605 of the heat sink 601. The semiconductor modules 501 to 506 are disposed around the rotation axis of the motor 30 as the bus bars 16 to 19 are bent on the radially outside part of the heat sink 601 and along the outer periphery of the heat sink 601. This promotes the dissipation of heat from the semiconductor modules 501 to 506. Therefore, the present embodiment can also be applied to any other electric power assist apparatuses, in which a large current flows to a motor.

(5) In the electronic circuit-integrated motor device 1, the capacitors 701 to 706 for the semiconductor modules 501 to 506 are disposed on the same side as the heat sink 601, that is, positioned in the radially inside part of the heat sink 601 such that the capacitors 701 to 706 do not protrude in the radially inward direction from the radially inside wall surface of the heat sink 601, that is, arc portion 609. More specifically, the capacitors 701 to 706 are housed in the accommodation sections 606, which are formed on the heat sink 601. This makes it possible to provide a space on the radially outside part of the semiconductor modules 501 to 506. This space facilitates, for instance, the routing of electrical wires.

(6) In the electronic circuit-integrated motor device 1, the heat dissipation surfaces of the semiconductor modules 501 to 506 are in contact with the sidewall surfaces 605 of the heat sink 601. This configuration further promotes the dissipation of heat from the semiconductor modules 501 to 506.

(7) Further, as the sidewall surfaces 605 are plane surfaces, the heat dissipation surfaces of the semiconductor modules 501 to 506 are also plane surfaces. This structure is advantageous from the viewpoint of ease of planar processing for the semiconductor modules 501 to 506.

(8) In the electronic circuit-integrated motor device 1, the heat sink 601 is formed into an octagon-shaped thick-walled cylinder and positioned around the central axis of the shaft 401. In addition, the choke coil 52 is positioned on the radially inside central part of the heat sink 601. Therefore, the physical size of the electronic circuit-integrated motor device 1 can be minimized even when the physical size of the employed choke coil 52 is relatively large.

(9) Further, the heat sink 601 has two cut surfaces 603, 604 in parallel to face each other forming a noncontiguous portion. The coil wire of the choke coil 52 is passed between the cut surfaces 603 and routed out in a radially outward direction. This facilitates the routing of electrical wires for the choke coil 52.

(10) In the electronic circuit-integrated motor device 1, the semiconductor modules 501 to 506 and the printed circuit board 801 are disposed in the axial direction. The semiconductor modules 501 to 506 include the control terminals 509, which are soldered to the printed circuit board 801. This permits the control terminals 509 to establish electrical connections. Therefore, the configuration does not become complicated even when the control circuit 70 is positionally independent of the semiconductor modules 501 to 506.

(11) In the electronic circuit-integrated motor device 1, the semiconductor modules 501 to 506 have the coil terminals 508, which are positioned toward the end wall 106, which is opposite to the printed circuit board 801. The coil terminal 508 is electrically connected to the lead wire 206. This makes it relatively easy to make an electrical connection to the coil 205 for the stator 201.

(12) In the electronic circuit-integrated motor device 1, the magnet 402 is mounted on the leading end of the shaft 401. The position sensor 73 on the printed circuit board 801 detects the rotational position of the magnet 402 to determine the rotational position of the shaft 401. This makes it relatively easy to detect the rotation of the motor 30.

(13) In the electronic circuit-integrated motor device 1, the W1 semiconductor module 503 and the U2 semiconductor module 504 include the FET 67, which provides protection against reverse connection. This makes it possible to prevent the capacitors 701 to 706 from being damaged even when an erroneous power source connection is made.

(14) In the electronic circuit-integrated motor device 1, the semiconductor modules 501 to 506 variously relate to the three phases, that is, the U-phase, V-phase, and W-phases. More specifically, the U1 and U2 semiconductor modules 501, 504 relate to the U-phase; the V1 and V2 semiconductor modules 502, 505 relate the V-phase; and the W1 and W2 semiconductor modules 503, 506 relate to the W-phase. Further, the semiconductor modules 501 to 503 are coupled by the first bus bar 16 and the second bus bar 17 to form the linked semiconductor module unit 10, and the semiconductor modules 504 to 506 are coupled by the first bus bar 18 and the second bus bar 19 to form the linked semiconductor module unit 20. As the semiconductor modules 501 to 506 are functionally modularized, it is easy to configure the inverter circuits 60, 68.

<Linking Structure of Linked Semiconductor Module Unit>

Figure 14:
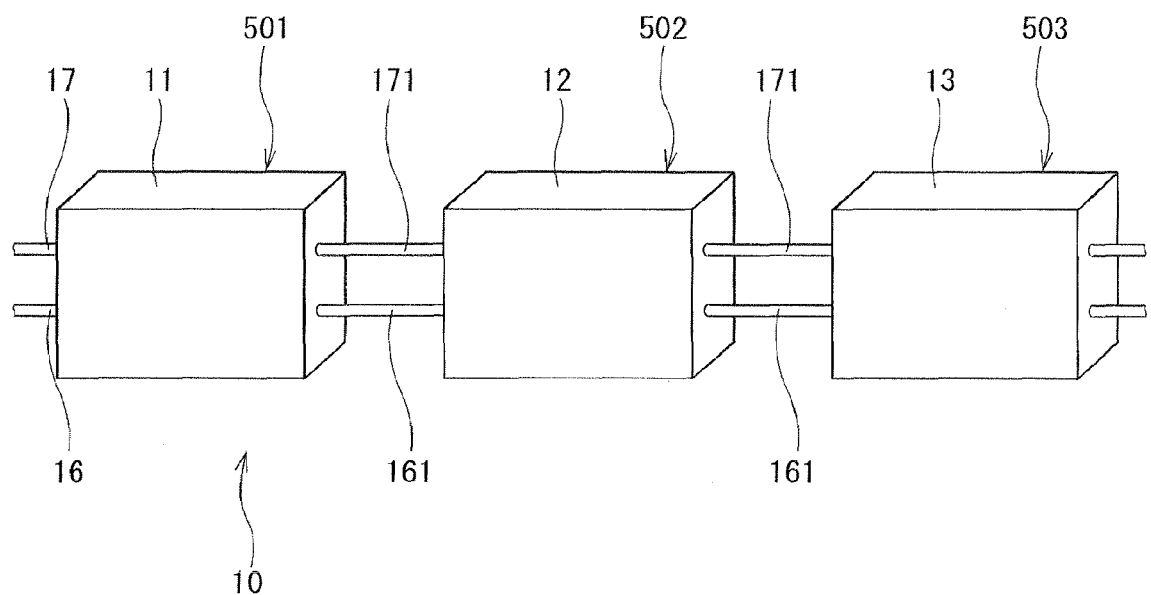
FIG. 14 is a schematic view showing the linked semiconductor module unit according to the first embodiment.
Figure 15:
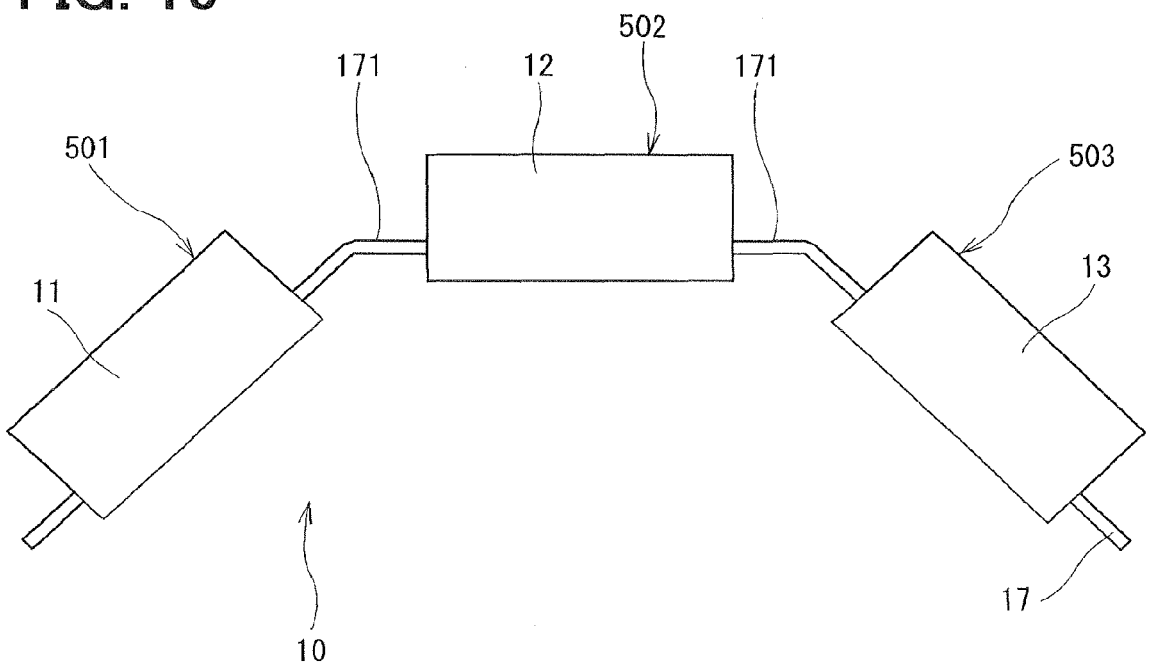
FIG. 15 is a schematic view showing the linked semiconductor module unit according to the first embodiment.
Figure 16:
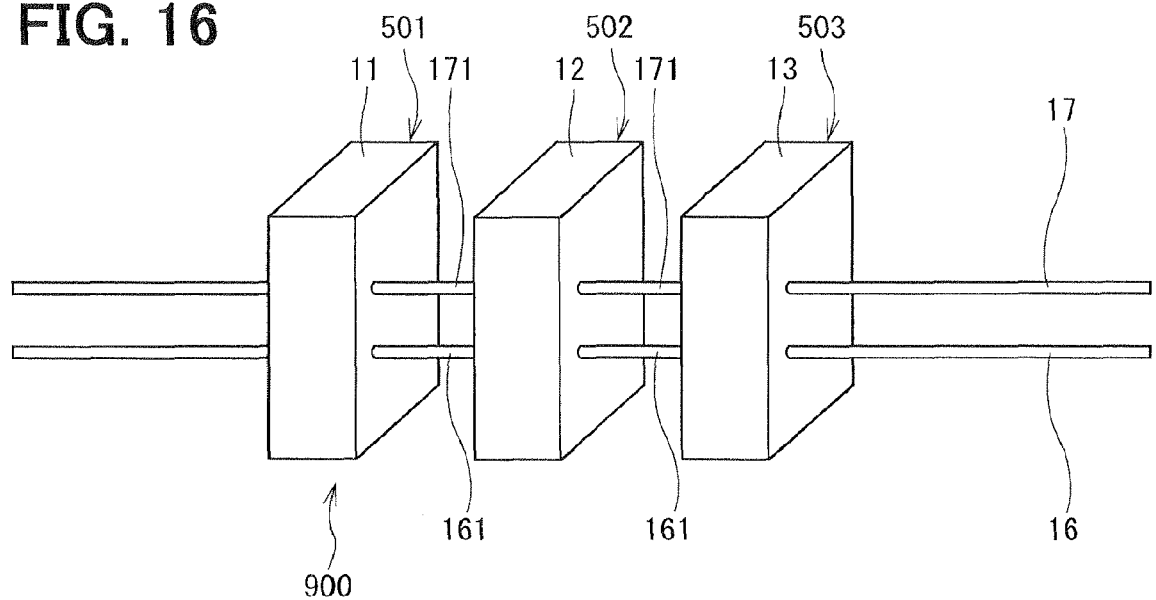
FIG. 16 is a schematic view showing a linked semiconductor module unit according to the second embodiment of the present invention.

The linking configuration according to the first embodiment shown in FIGS. 1, 3, is shown in a simplified manner in FIGS. 14, 15, in which the semiconductor chips (not shown) are mounted in parallel with the largest-area surface of the resin part substantially shaped like a rectangular parallelepiped. Further, the first terminals 511 to 513, the second terminals 514 to 516, the coil terminals 581 to 583, and the control terminals 591 to 593 are not shown in FIGS. 14, 15. In the example shown FIG. 14, the linked semiconductor module unit 10 is configured so that the first bus bar 16 and the second bus bar 17 are embedded in the resin parts 11 to 13 in parallel with the semiconductor chip surface. The first bus bar 16 and the second bus bar 17 protrude from the opposing surfaces of the resin parts 11 to 13. In the example shown in FIG. 15, the first bus bar 16 and the second bus bar 17 include the exposed portions 161, 171, which are positioned between the semiconductor modules 501 to 503 and not embedded in the resin parts 11 to 13, and are bent at the exposed portions 161, 171. However, the semiconductor modules 11 to 13 may be linked differently as described below.

Second Embodiment

In a linked semiconductor module unit 900 according to the second embodiment, the first bus bar 16 and the second bus bar 17 are positioned perpendicularly to the semiconductor chip surface. The first bus bar 16 and the second bus bar 17 protrude from the opposing surfaces of the resin parts 11 to 13. That is, the first bus bar 16 and the second bus bar 17 link the three semiconductor modules 501 to 503 in the direction of their thickness. Thus, the bus bars 16, 17 are not in parallel to but perpendicular to the sidewall surfaces of the largest surface area as opposed to the configuration of FIGS. 14, 15. The use of this configuration produces the same advantages as the first embodiment and makes it possible to reduce the sizes of the first and second bus bars 16, 17.

Third Embodiment

Figure 17:
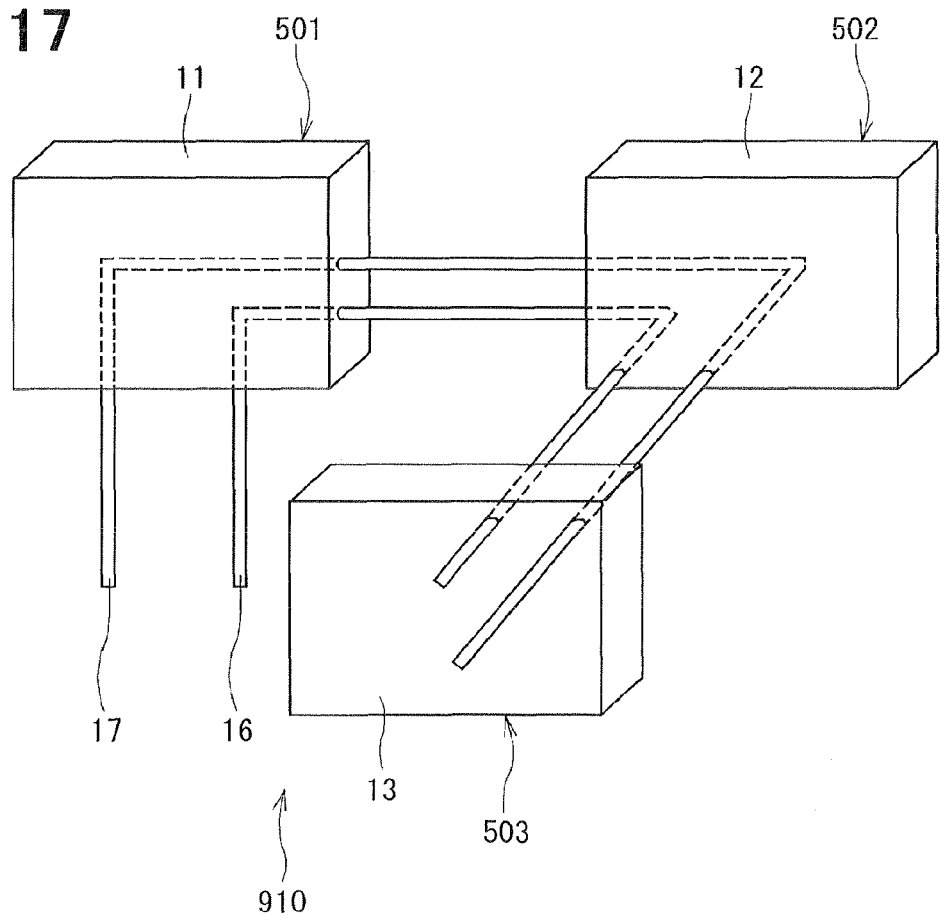
FIG. 17 is a schematic view showing a linked semiconductor module unit according to the third embodiment of the present invention.

In a linked semiconductor module unit 910 according to the third embodiment, the semiconductor modules 501 to 503 are disposed in a polygonal pattern as shown in FIG. 17, as opposed to the first and the second embodiment, in which the semiconductor modules 501 to 503 are disposed in a substantially linear pattern. In FIG. 17, the embedded portions of the bus bars 16, 17 are shown schematically by dotted lines.

The linked semiconductor module unit 910 is configured so that the first bus bar 16 and the second bus bar 17 are positioned in parallel with the semiconductor chip surfaces of the semiconductor modules 501 to 503, which are disposed in a polygonal pattern. Further, the first bus bar 16 and the second bus bar 17 protrude from the neighboring surfaces of the resin parts 11 and 12, although the bus bars 16 and 17 protrude from the opposing surfaces of the resin part 13. The use of this configuration produces the same advantages as the first embodiment and makes it possible to place the semiconductor modules at desired positions.

<Component Configuration of Linked Semiconductor Module Unit>

Figure 18:
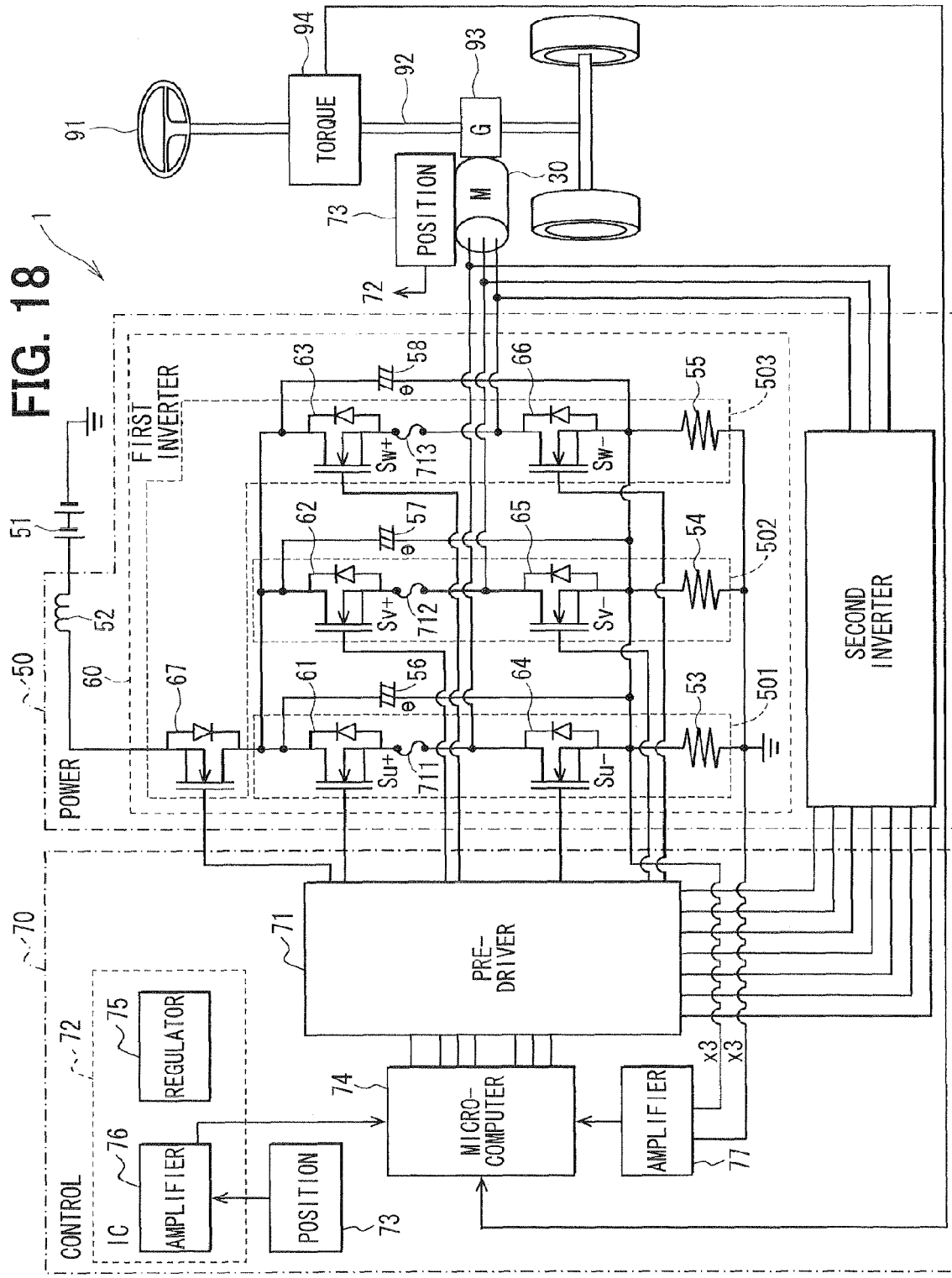
FIG. 18 is an electric circuit diagram showing an electric power steering system of a vehicle that uses a linked semiconductor module unit according to the fourth embodiment of the present invention.
Figure 19:
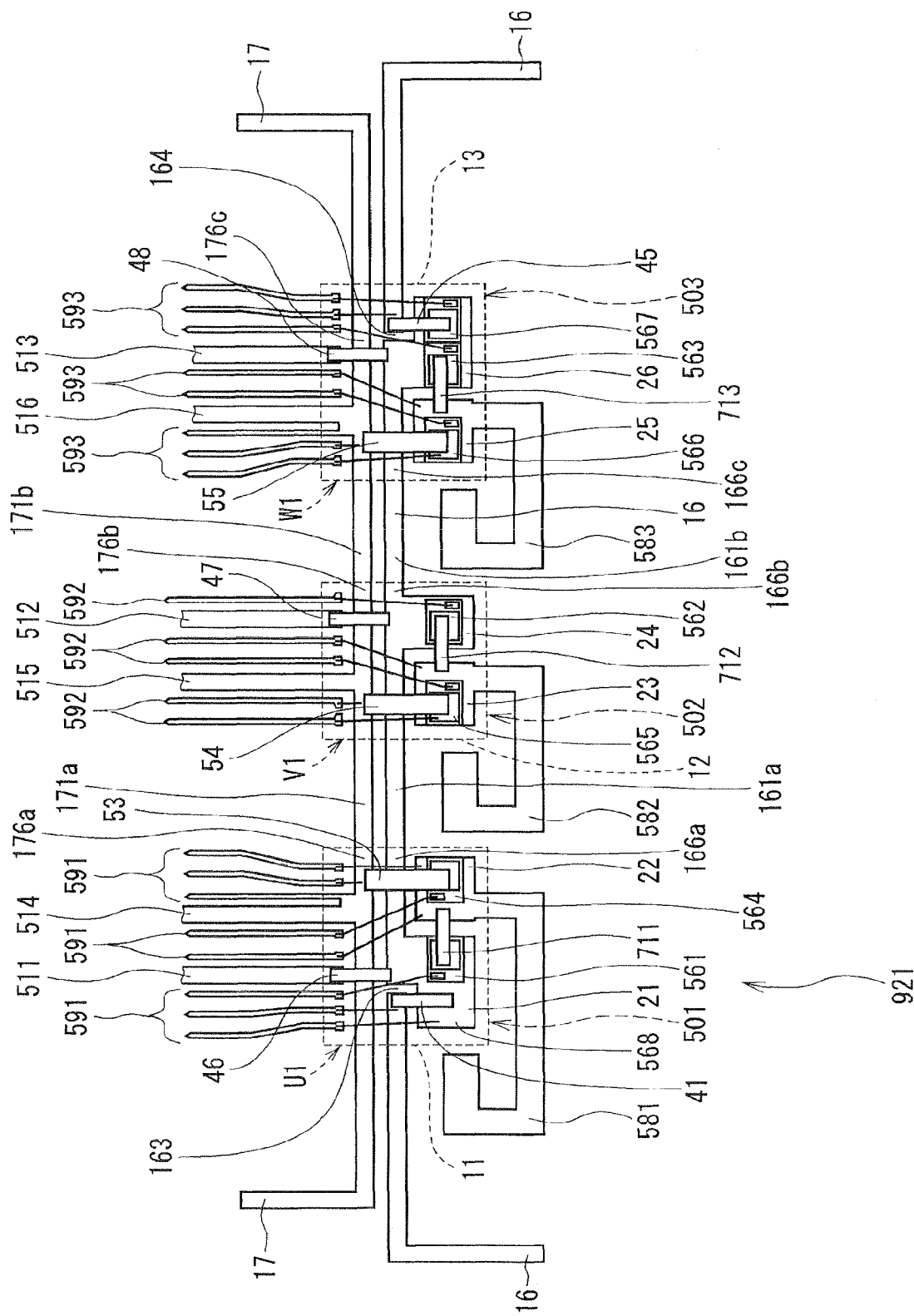
FIG. 19 is a plan view showing the linked semiconductor module unit according to the fourth embodiment with its resin parts removed.
Figure 20:
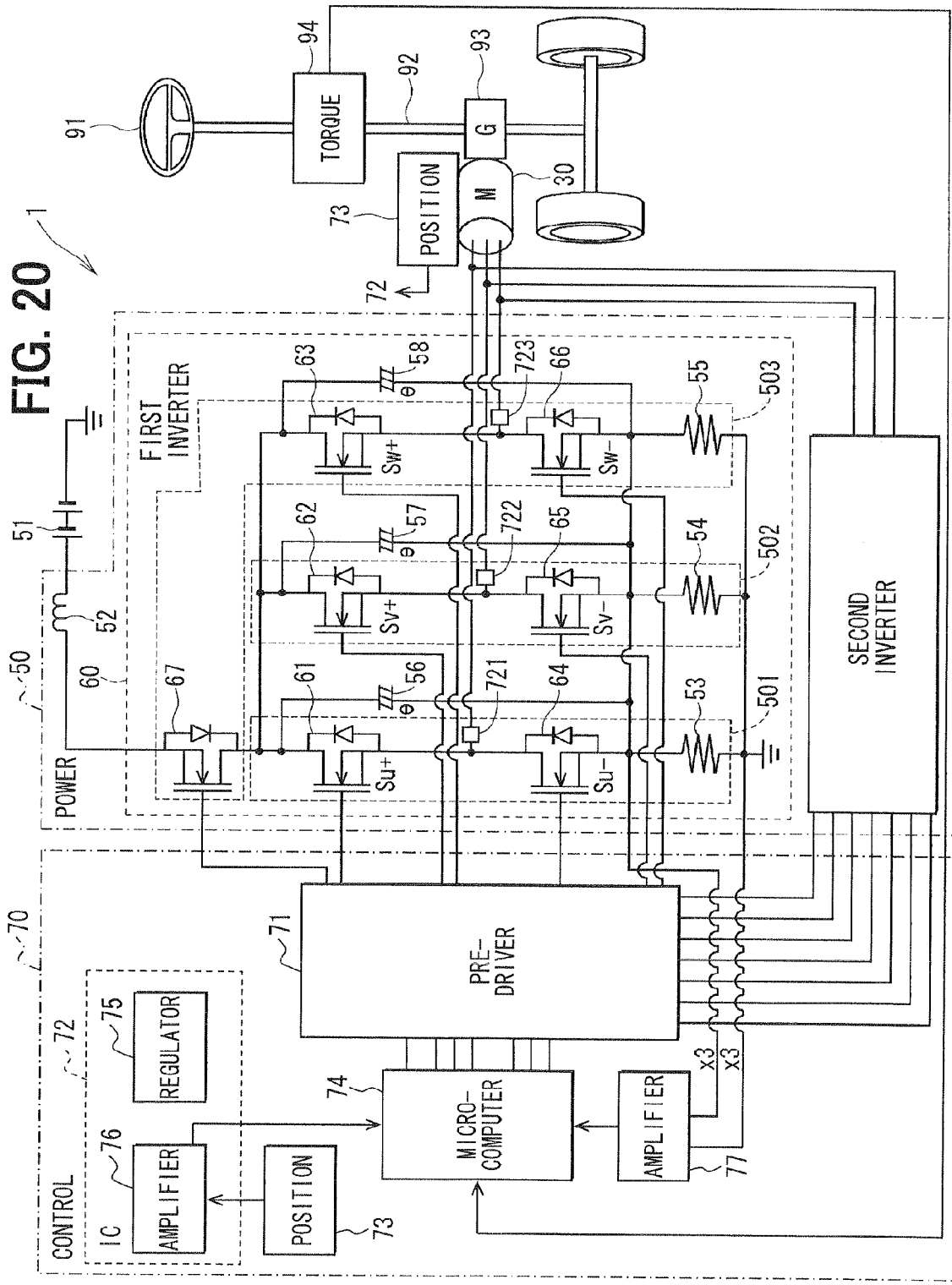
FIG. 20 is an electric circuit diagram showing an electric power steering system that uses a linked semiconductor module unit according to the fifth embodiment of the present invention.
Figure 21:
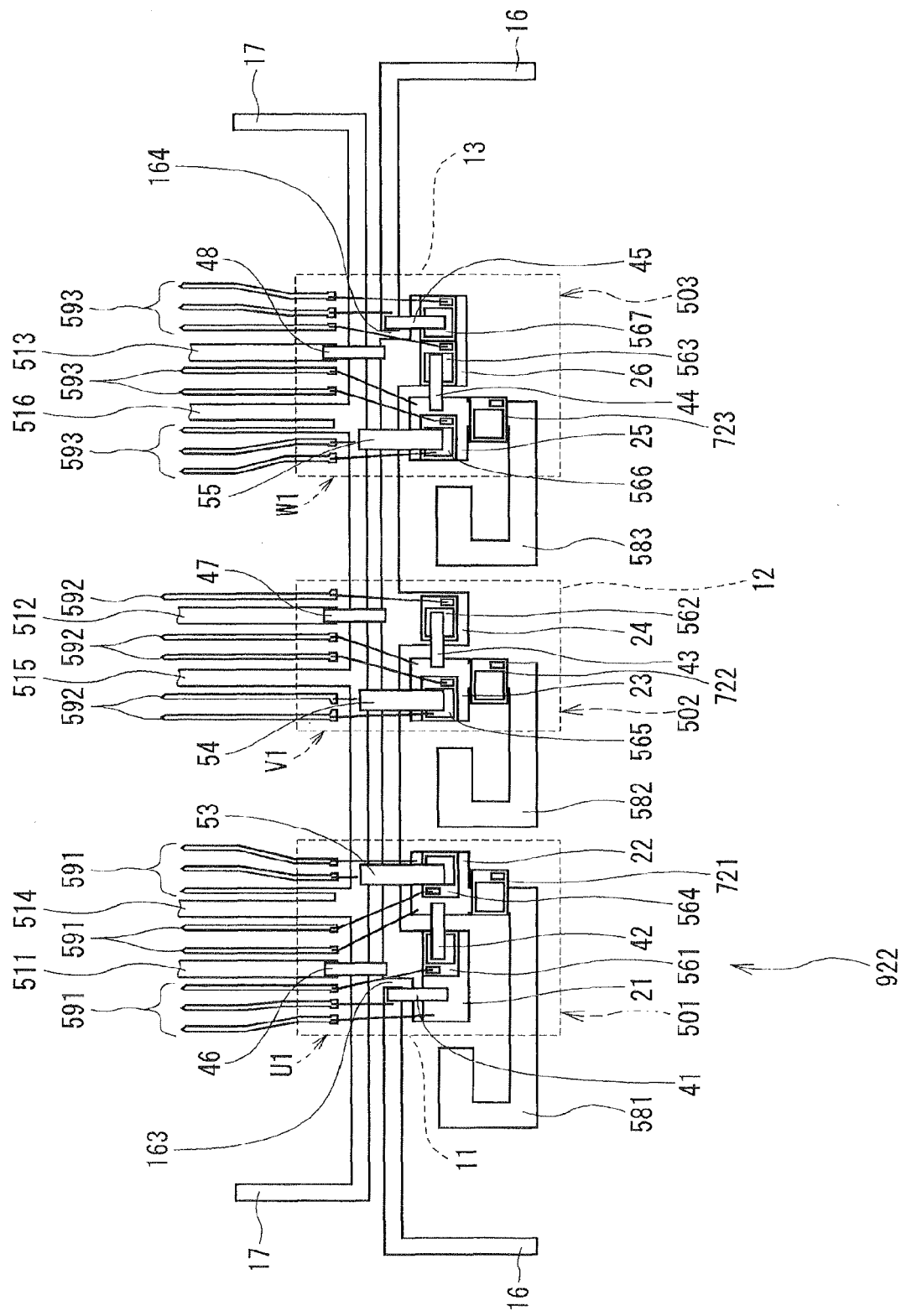
FIG. 21 is a plan view showing the linked semiconductor module unit according to the fifth embodiment with its resin parts removed.
Figure 22:
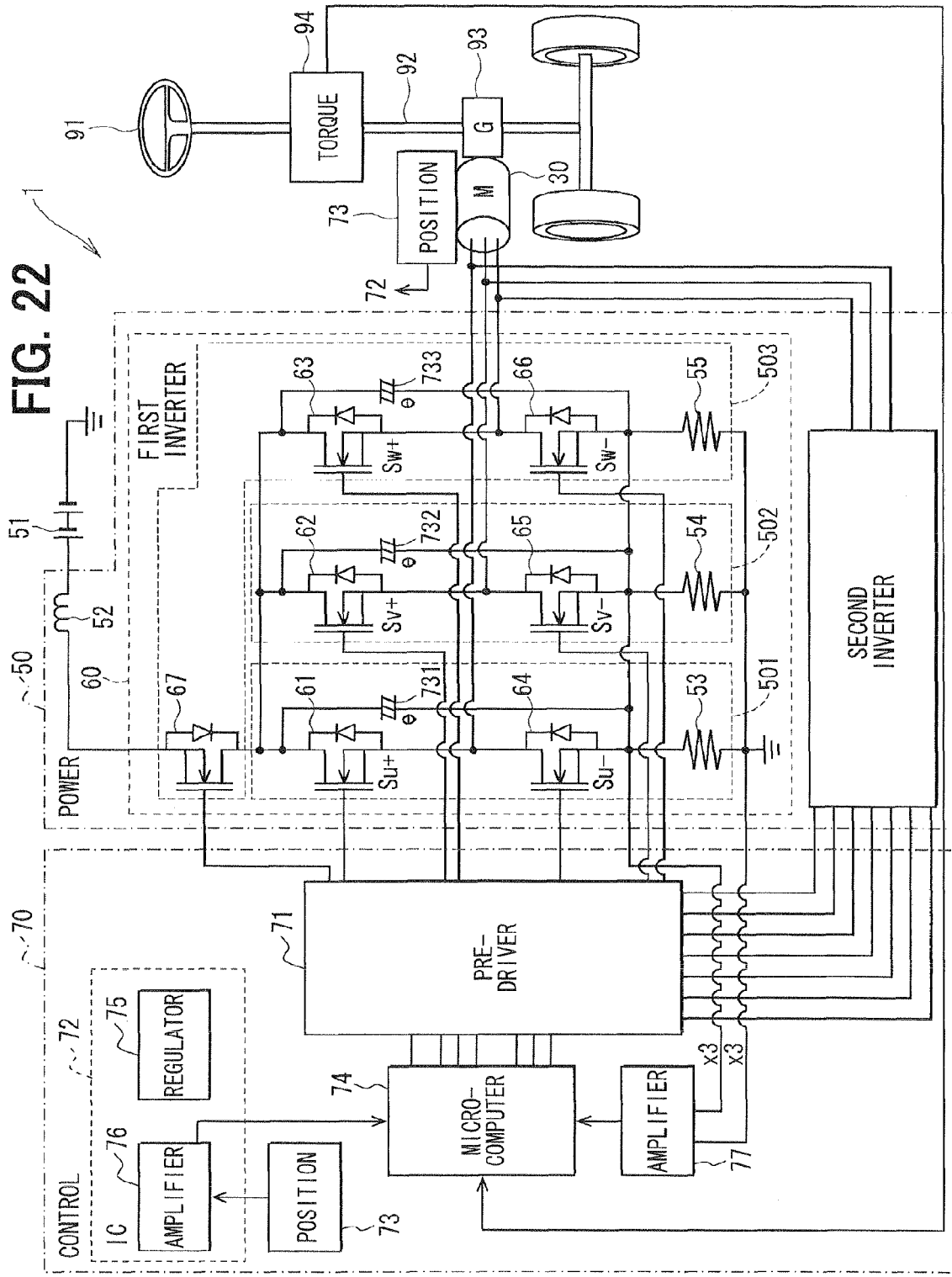
FIG. 22 is an electric circuit diagram an electric power steering system of a vehicle that uses a linked semiconductor module unit according to the sixth embodiment of the present invention.
Figure 23:
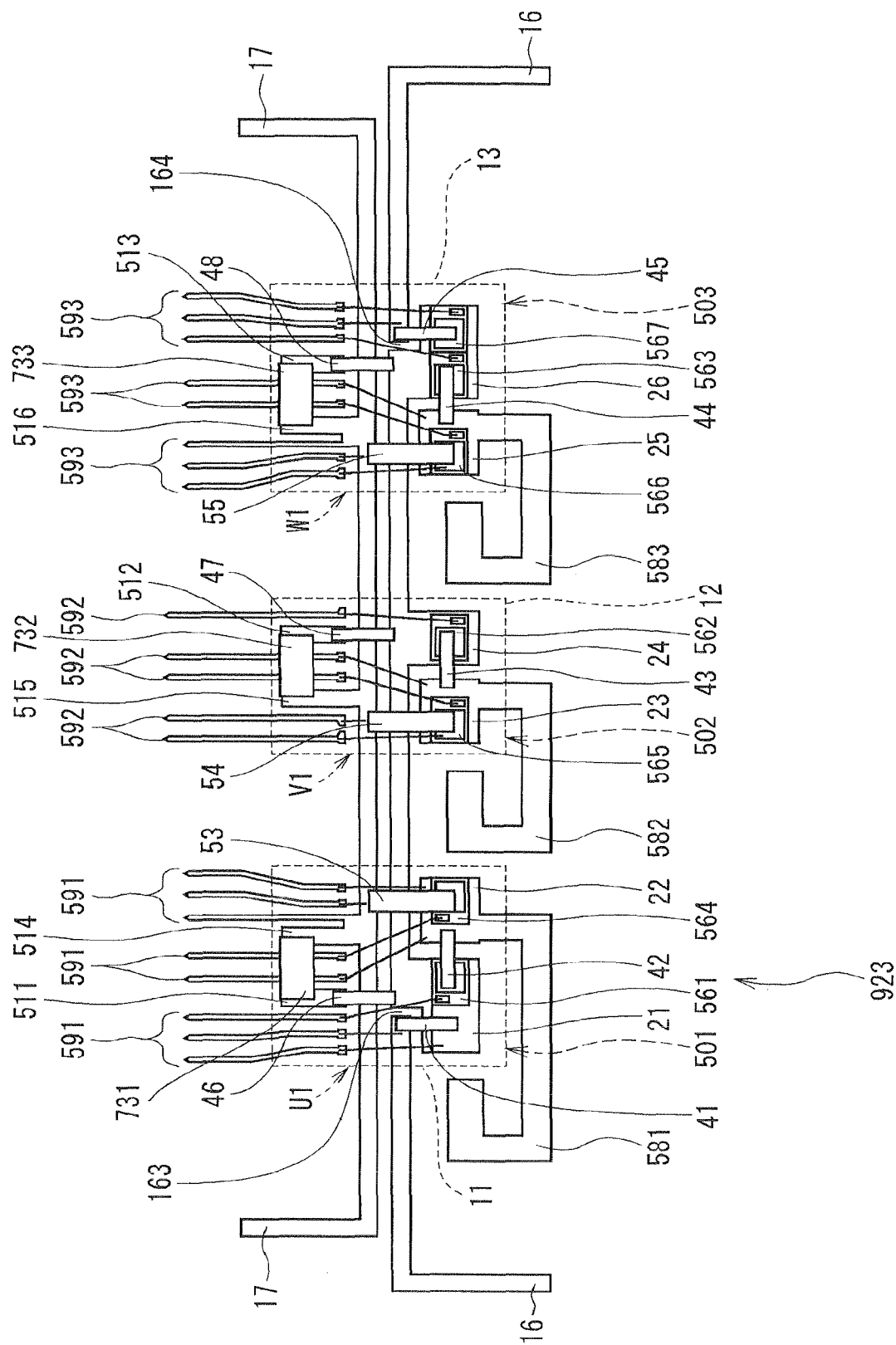
FIG. 23 is a plan view showing the linked semiconductor module unit according to the sixth embodiment with its resin parts removed.

In the first embodiment, the U1 semiconductor module 501 includes the FETs 61, 64 and the shunt resistor 53; the V1 semiconductor module 502 includes the FETs 62, 65 and the shunt resistor 54; and the W1 semiconductor module 503 includes the FETs 63, 64, 67 and the shunt resistor 55. That is, the U1 and V1 semiconductor modules 501, 502 include two switching elements and the shut resistor, whereas the W1 semiconductor module includes two switching elements, the power relay, and the shunt resistor. The semiconductor modules may include various other electronic parts. In the following fourth to sixth embodiments, the component configuration of the linked semiconductor module unit will be described with reference to FIGS. 18 to 23. FIGS. 18, 20, and 22 correspond to FIG. 6, which illustrates the first embodiment. FIGS. 19, 21, and 23 correspond to FIG. 2, which illustrates the first embodiment. It should be noted that FIGS. 19, 21, and 23 do not show the semiconductor chip 567 on which the FET 67 serving as a power relay is not mounted.

Fourth Embodiment

In a linked semiconductor module unit 921 according to the fourth embodiment, as shown in FIG. 18, the inverter circuit 60 includes fuses 711 to 713. The fuse 711 is connected between the FET (Su+) 61 and the FET (Su−) 64. The fuse 712 is connected between the FET (Sv+) 62 and the FET (Sv−) 65. The fuse 713 is connected between the FET (Sw+) 63 and the FET (Sw−) 66.

In the linked semiconductor module unit 921, as shown in FIG. 19, the fuse 711 takes the place of the wire 42 shown in FIG. 2 and connects the semiconductor chip 561 to the land 22; the fuse 712 takes the place of the wire 43 shown in FIG. 2 and connects the semiconductor chip 562 to the land 23; and the fuse 713 takes the place of the wire 44 shown in FIG. 2 and connects the semiconductor chip 563 to the land 25.

The use of the configuration produces the same advantages as the first embodiment. Further, when an overcurrent flows, the fuses 711 to 713 blow out to prevent a fire hazard.

Fifth Embodiment

In an electronic circuit-integrated semiconductor module unit 922 according to the fifth embodiment, as shown in FIG. 20, the inverter circuit 60 includes motor relays 721 to 723, which include the same MOSFETs as the FETs 61 to 67. The motor relay 721 is connected between the motor 30 and a junction between the FET (Su+) 61 and FET (Su−) 64. The motor relay 722 is connected between the motor 30 and a junction between the FET (Sv+) 62 and FET (Sv−) 65. The motor relay 723 is connected between the FET (Sw+) 63 and the FET (Sw−) 66.

More specifically, in the linked semiconductor module unit 922, as shown in FIG. 21, the motor relay 721 is mounted at a joint between the coil terminal 581 and the land 22; the motor relay 722 is mounted at a joint between the coil terminal 582 and the land 23; and the motor relay 723 is mounted at a joint between the coil terminal 583 and the land 25.

If the W1-phase is in the continuous conduction, for instance, due to a short circuit, the motor relays 721, 722 are turned off to avoid motor locking. If the V1-phase is in the continuous conduction, for instance, due to a short circuit, the motor relays 721, 723 are turned off to avoid motor locking. If the U1-phase is in the continuous conduction, for instance, due to a short circuit, the motor relays 722, 723 are turned off to avoid motor locking.

The use of the motor relays 721 to 723 produces the same advantages as the first embodiment. Further, motor locking can be avoided by locking the motor relays 721 to 723 in the event of short circuit or other malfunction.

Sixth Embodiment

In a linked semiconductor module unit 923 according to the sixth embodiment, as shown in FIG. 22, the semiconductor modules 501 to 503 include capacitors 731 to 733 therein. The capacitor 731 is mounted in the semiconductor module 501; the capacitor 732 is mounted in the semiconductor module 502; and the capacitor 733 is mounted in the semiconductor module 503. This makes it possible to eliminate a switching surge and noise that may occur when the FETs 61 to 66 are turned on or off.

The semiconductor module component configurations described in conjunction with the first, fourth, fifth, and sixth embodiments can be combined as appropriate. For example, the fuses, motor relays, and capacitors can be incorporated into the same semiconductor module.

<Horizontal Layout of Linked Semiconductor Module Units>

In the first embodiment, the semiconductor modules 501 to 506 are disposed perpendicularly with respect to the motor axial line such that the heat dissipation surfaces of the semiconductor modules 501 to 506 are in contact with the heat sink 601. However, the semiconductor modules 501 to 506 need not always be disposed perpendicularly and may alternatively be disposed horizontally. When the semiconductor modules 501 to 506 are disposed horizontally, the line perpendicular to the semiconductor chip surface is parallel to the central axis of the shaft 401. For example, in a situation where the first embodiment does not include the heat sink 601 that is mounted in the raised manner on the end wall 106 of the motor case 101 and oriented toward the central axis of the shaft 401, the semiconductor modules 501 to 506 are disposed in such a manner that the heat dissipation surfaces are in contact with the axial end wall 106 of the motor case 101. In this instance, the linked semiconductor module units 501 to 506 may be disposed in accordance with the third embodiment shown in FIG. 17 or in accordance with the seventh embodiment or the eighth embodiment as described below.

Seventh Embodiment

Figure 24:
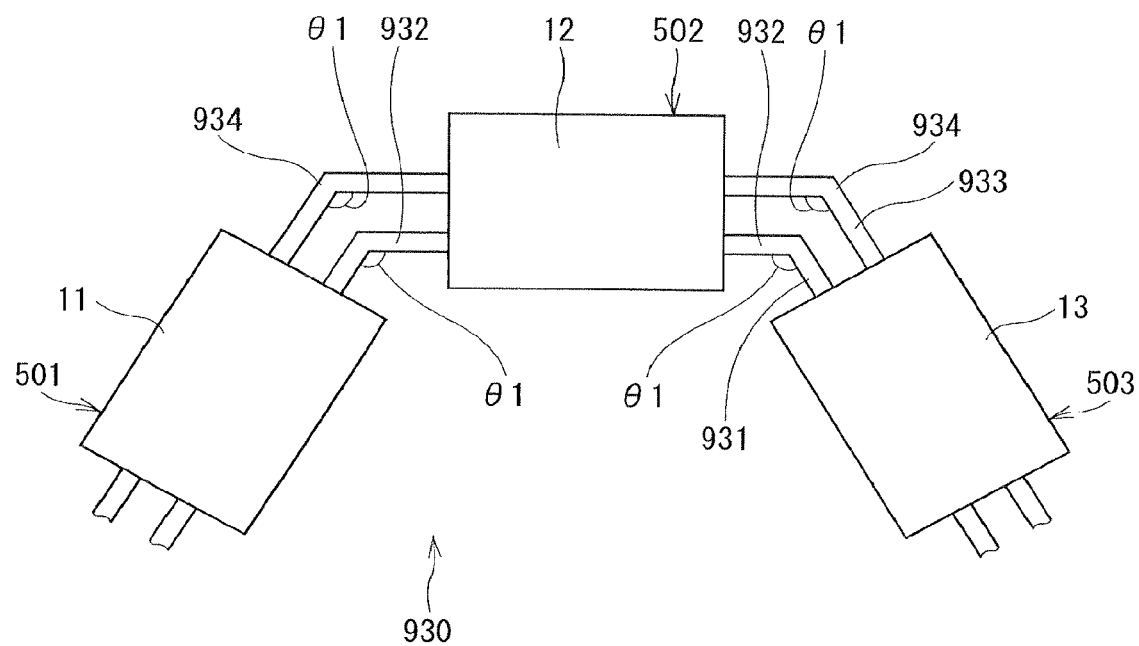
FIG. 24 is a schematic view showing a linked semiconductor module unit according to the seventh embodiment of the present invention.

An electronic circuit-integrated semiconductor module unit 930 according to the sixth embodiment is shown in FIG. 24. It should be noted that, for example, the coil terminals, capacitor terminals, and control terminals are not shown in FIG. 24.

A first bus bar 931 of the linked semiconductor module unit 930 is press-formed so that its angle relative to an exposed portion 932, which is exposed from the resin parts 11 to 13 between the semiconductor modules 501 to 503, is θ1. Similarly, a second bus bar 933 is press-formed so that its angle relative to an exposed portion 934, which is exposed from the resin parts 11 to 13 between the semiconductor modules 501 to 503, is θ1. Consequently, when, for instance, two linked semiconductor module units each including three semiconductor modules are used, the six semiconductor modules can be disposed horizontally in the same plane around the shaft rotation axis, that is, the central axis of the shaft 401. The first bus bar 931 and the second bus bar 933 are formed in left-right symmetry with respect to the center of the V1 semiconductor module 502. However, the first and second bus bars 931, 933 need not always be left-right symmetric. Alternatively, the angle θ1 may be changed in accordance with the positions of the semiconductor modules 501 to 503.

Eighth Embodiment

In a linked semiconductor module unit 940 according to the eighth embodiment, as shown in FIGS. 25 to 28, a first bus bar 941 of the linked semiconductor module unit 940 is formed in a substantially linear shape. The first bus bar 941 can be bent in substantially the same plane at a bent portion 943 of an exposed portion 942 that is positioned between the semiconductor modules 501 to 503 and exposed from the resin parts 11 to 13.

Figure 25:
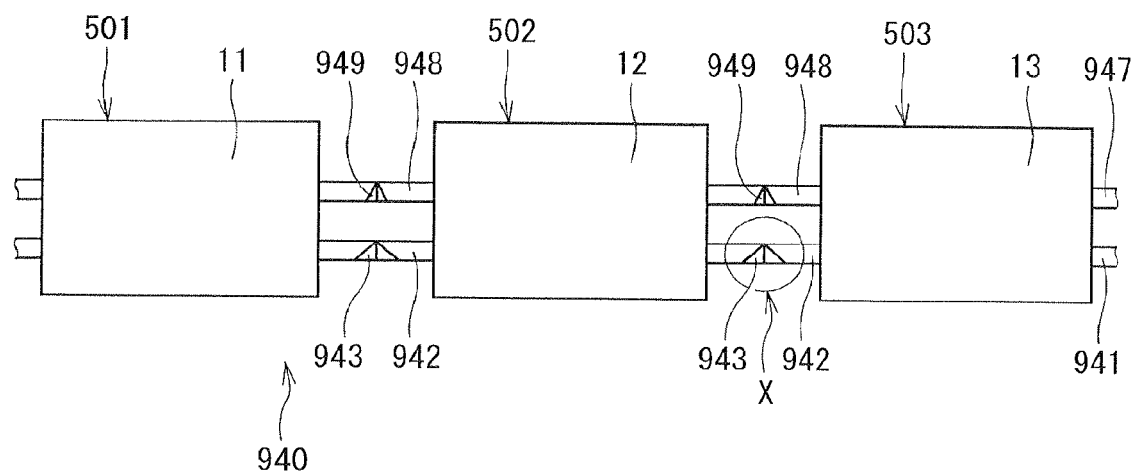
FIG. 25 is a schematic view showing a linked semiconductor module unit according to the eighth embodiment of the present invention.
Figure 26:
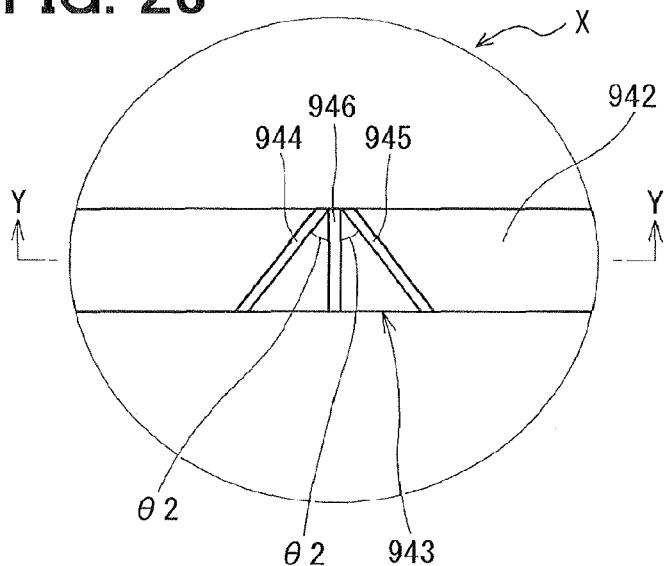
FIG. 26 is an enlarged schematic view showing a part of a bus bar of the semiconductor module indicated by X in FIG. 25.

The bent portion 943, which is indicated by X in FIG. 25, is shown in detail in FIG. 26 as an enlarged schematic view. The bent portion 943 is further shown in FIG. 27, which is a cross-sectional view taken along line Y-Y in FIG. 26.

Figure 27:
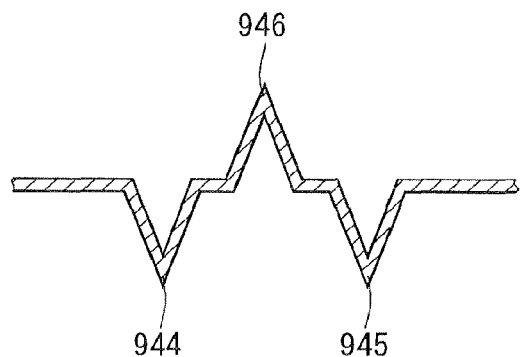
FIG. 27 is a cross-sectional view taken along line Y-Y in FIG. 26.
Figure 28:
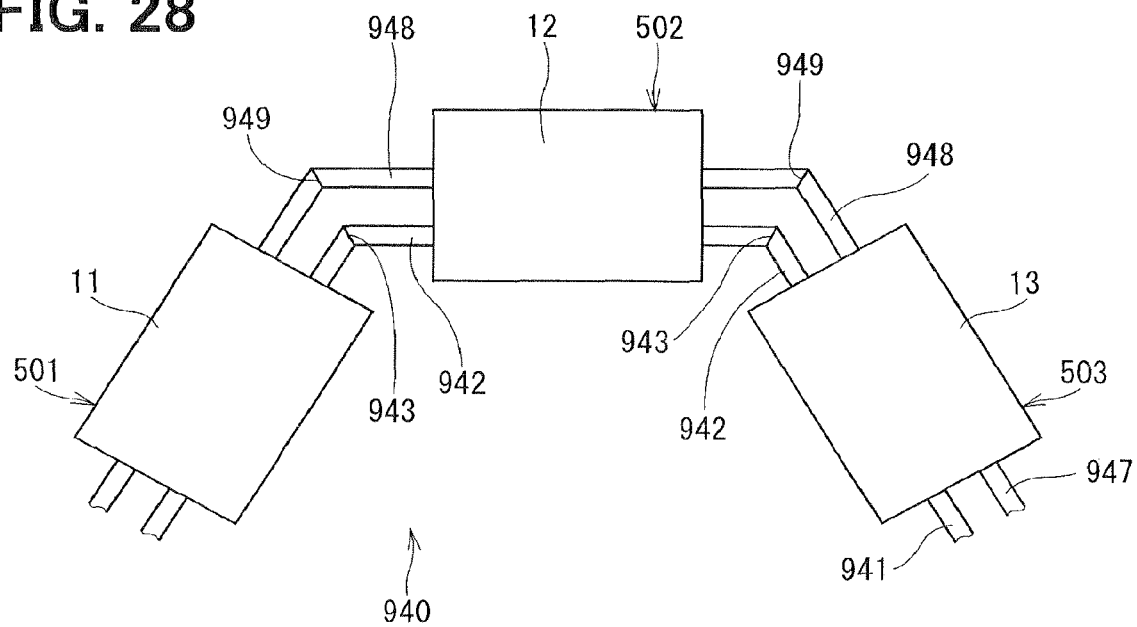
FIG. 28 is a schematic view showing a bent linked semiconductor module unit according to the eighth embodiment of the present invention.
Figure 29:
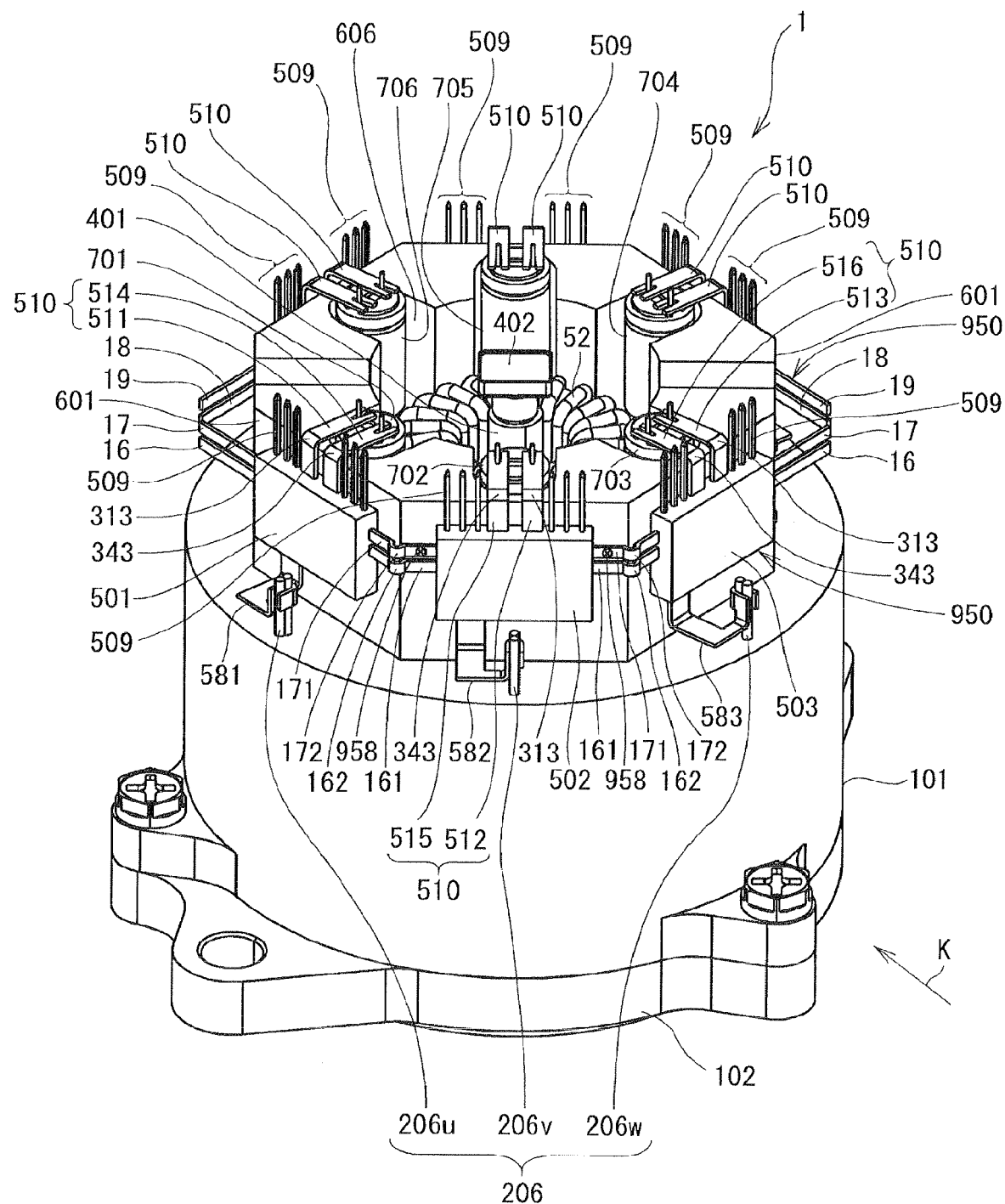
FIG. 29 is a perspective view showing an electronic circuit-integrated motor device that uses a linked semiconductor module unit according to the ninth embodiment of the present invention.

As shown in FIG. 27, the bent portion 943 is press-formed so that a peak portion 946 is formed between two valley portions 944, 945. As shown in FIG. 26, the two valley portions 944, 945 are formed on either side of the peak portion 946 so that a predetermined angle of θ2 is formed from one end of the peak portion 946 in the direction of the width of the first bus bar 941. When the valley portions 944, 945 and the peak portion 946 are folded, the first bus bar 941 is inflected in the same plane except for the bent portion 943, as shown in FIG. 28, so that the three semiconductor modules 501 to 503 can be disposed horizontally in the same plane.

A second bus bar 947 is formed in a substantially linear shape, as is the case with the first bus bar 941. The second bus bar 947 can be bent in substantially the same plane at a bent portion 949 of an exposed portion 948 that is positioned between the semiconductor modules 501 to 503 and exposed from the resin parts 11 to 13. Like the bent portion 943 of the first bus bar 941, the bent portion 949 of the second bus bar 947 includes a peak portion and two valley portions, which are formed on either side of the peak portion. The angle θ3 (not shown) between the peak portion and valley portions of the bent portion 949 of the second bus bar 947 is smaller than the angle θ2 between the peak portion 946 and valley portions 944, 945 of the bent portion 943 of the first bus bar 941. The angles θ2 and θ3 are formed so that the first bus bar 941 and the second bus bar 947 are parallel to each other even after they are bent. The use of the above configuration makes it possible to prevent the resin parts 11 to 13 from being damaged when the first bus bar 941 and the second bus bar 947 are bent.

<Body Grounding>

In the first embodiment, grounding is achieved by connecting the second bus bars 17, 19 to a battery ground of the power source 51, for instance, with a connector or electrical wire not shown. A ninth embodiment will be described below by explaining about a grounding method that does not use any connector, wire, or the like.

Ninth Embodiment

Figure 30:
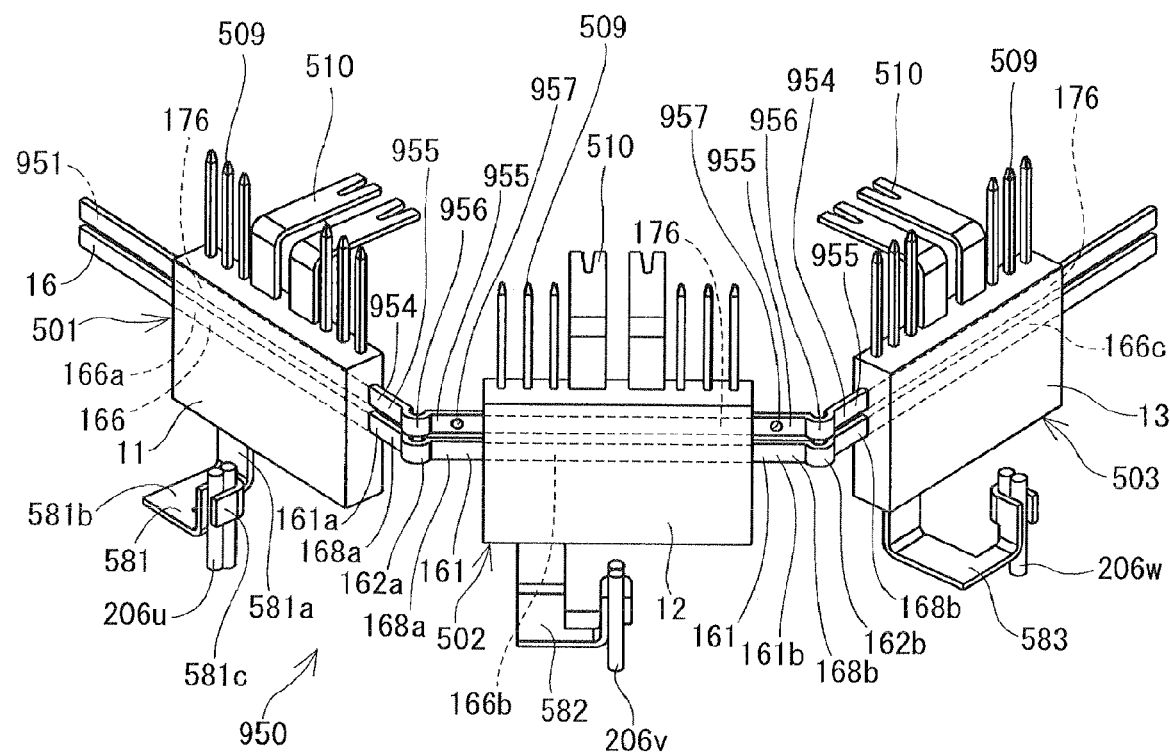
FIG. 30 is an enlarged perspective view showing the linked semiconductor module unit shown in FIG. 29.

In an electronic circuit-integrated motor device 1 according to the ninth embodiment, as shown in FIG. 30, a second bus bar 951 of a linked semiconductor module unit 950 is electrically connected to the heat sink 601, which is connected to a vehicle body ground. Therefore, the second bus bar 951 need not be connected to the ground for the power source 51 (FIG. 6).

As shown in FIG. 30, an exposed portion 954 of the second bus bar 951 includes a linear portion 955 and a curved portion 956 that is a circular bulge formed on the linear portion 955. A connection hole 957 is formed in the linear portion 955. In each of two exposed portions 954, the connection hole 957 is formed in the linear portion 955 that is positioned toward the V1 semiconductor module 502. Further, a screw hole (not shown) is formed in the heat sink 601. The screw hole is formed at a location corresponding to the location of the connection hole 957. The heat sink 601 according to the present embodiment is electrically connected to the vehicle body ground (not shown) through the motor case 101.

A screw 958, which is a connection member made of a conductive material, is screwed into the connection hole 957 and the screw hole of the heat sink 601. The heat sink 601, which is electrically connected to the vehicle body ground, is then electrically connected to the second bus bar 951 to achieve grounding. Therefore, the second bus bar 951 need not be connected to the battery ground. Further, the screw 958 doubles as a fastener that secures the linked semiconductor module unit 950 to the heat sink 601.

The screw 958 is used as a connection member. Alternatively, however, any other connection member may be used as far as it can electrically connect the second bus bar to the heat sink. For example, an elastically deformable V-shaped clip member may be used. Another alternative is to form a convex at a location corresponding to the location of the connection hole in the heat sink 601, insert the convex into the connection hole 957, and secure the convex with a C-ring or the like.

<Positional Relationship Between Linked Semiconductor Module Unit and Heat Sink>

In the first embodiment, the linked semiconductor module unit 10 is mounted on the radially outside part of the heat sink 601, bent along the heat sink 601, and disposed around the rotation axis of the motor 30 as shown in FIGS. 7 to 10. In the tenth embodiment and an eleventh embodiment, the positional relationship between the linked semiconductor module unit and heat sink are modified.

Tenth Embodiment

Figure 31:
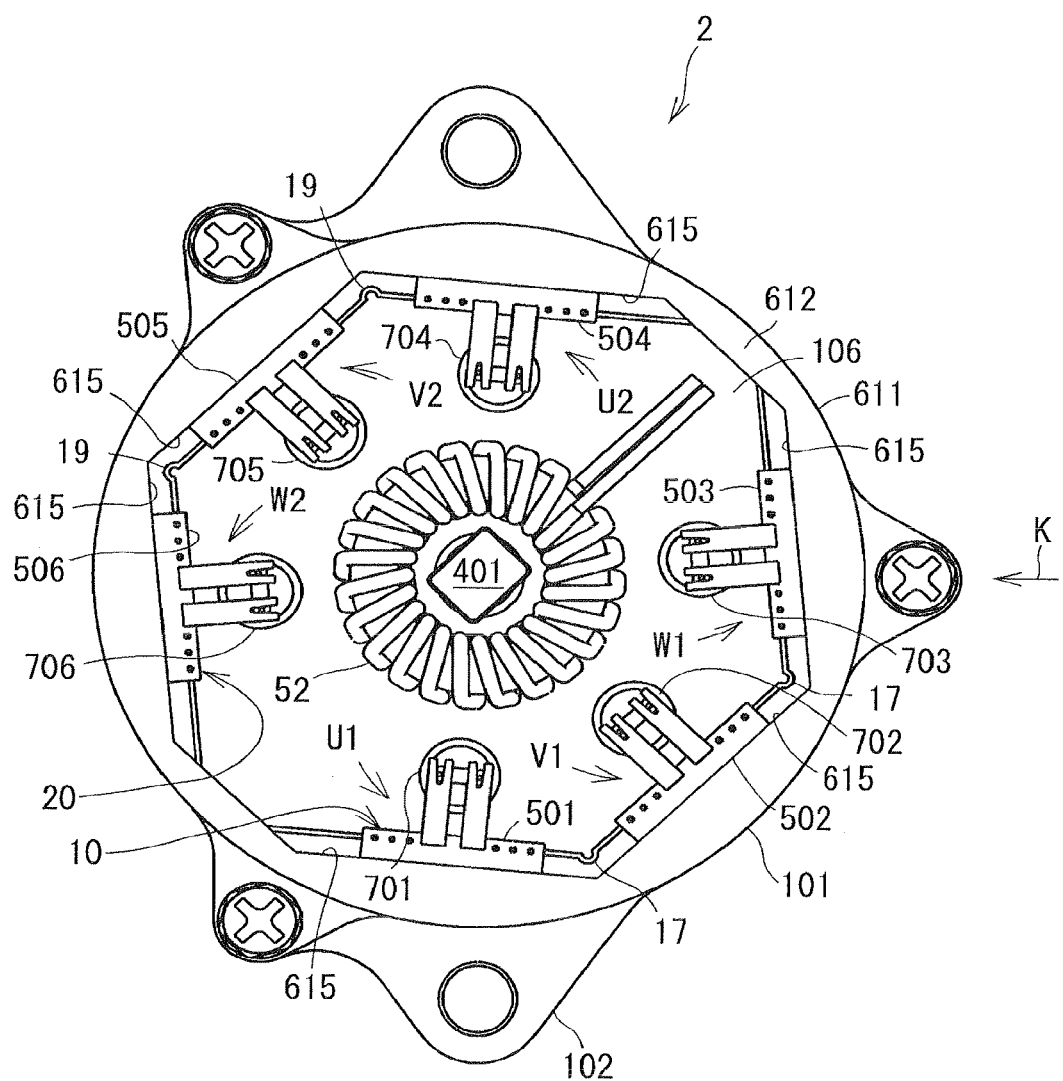
FIG. 31 is a top plan view showing an electronic circuit-integrated motor device that uses a linked semiconductor module unit according to a tenth embodiment of the present invention.
Figure 32:
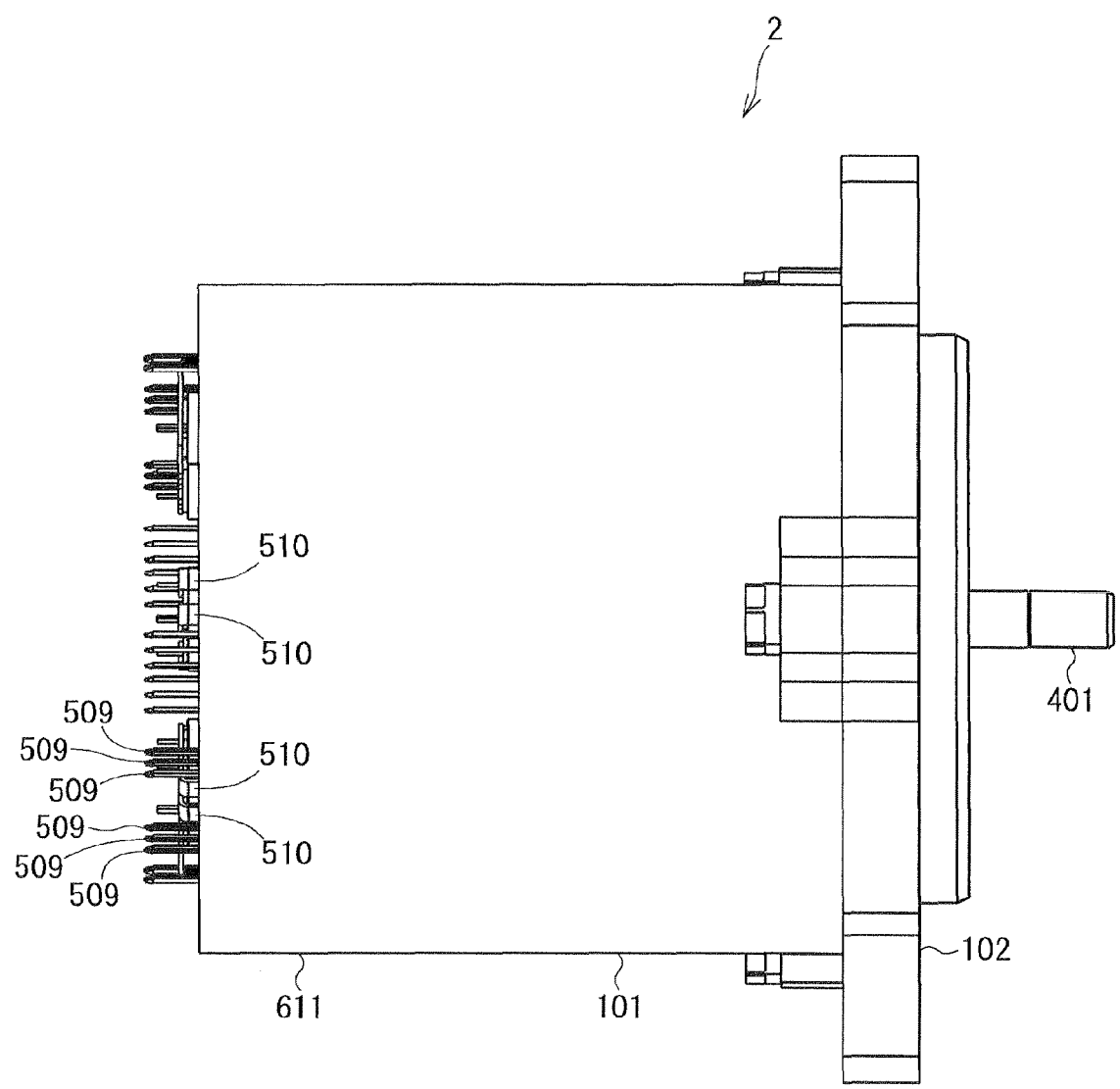
FIG. 32 is a side view showing the electronic circuit-integrated motor device that uses the linked semiconductor module unit according to the tenth embodiment.
Figure 33:
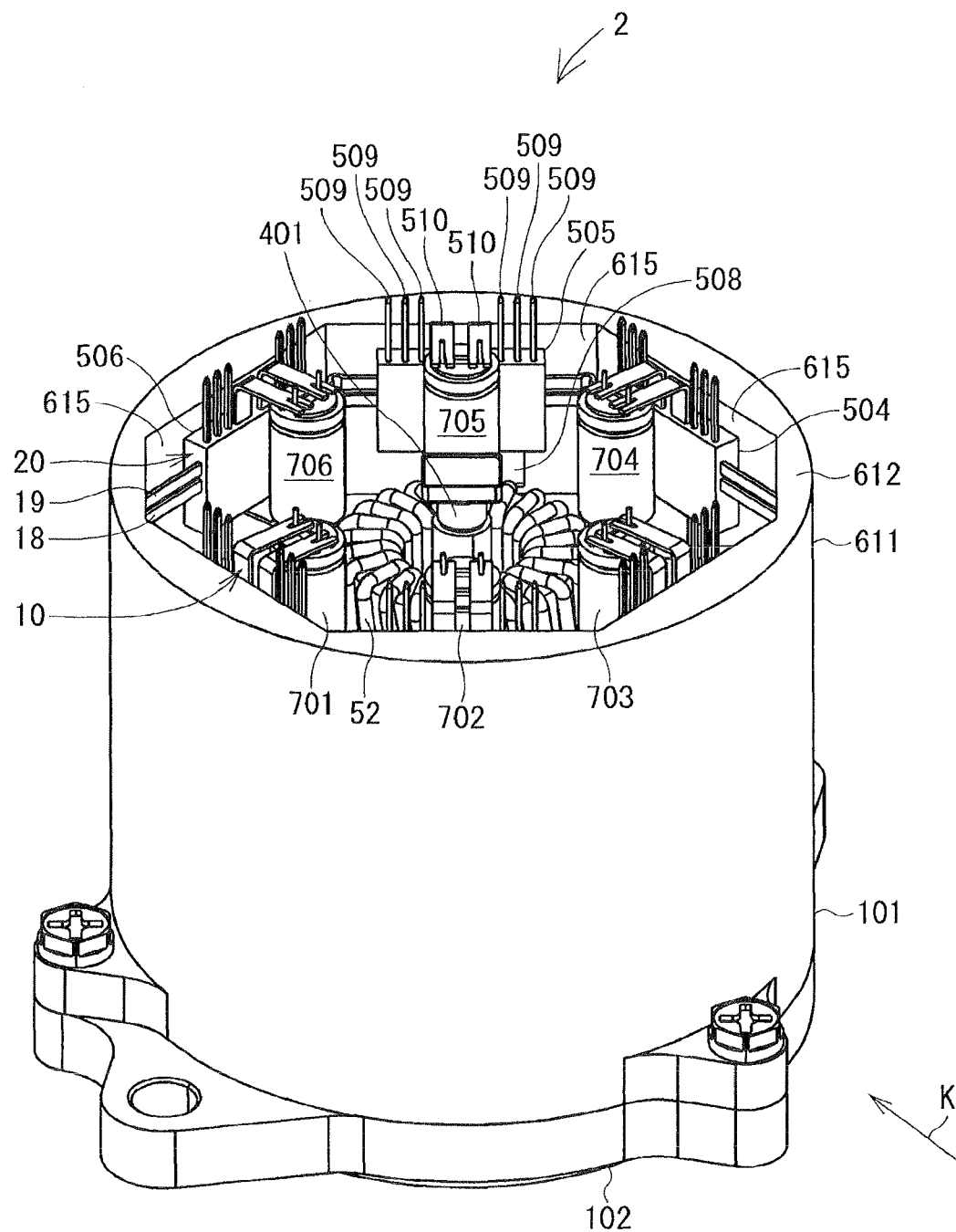
FIG. 33 is a perspective view showing the electronic circuit-integrated motor device that uses the linked semiconductor module unit according to the tenth embodiment.

An electronic circuit-integrated motor device 2 according to the tenth embodiment is shown in FIGS. 31 to 33, in which the cover and the printed circuit board are not shown.

A heat sink 611 is cylindrically shaped and mounted on the end wall 106 of the motor case 101 in a raised manner. The inner wall of the heat sink 611 is formed by eight sidewall surfaces 615. Consequently, an octagonal-column-shaped space is formed inside the heat sink 611. The outer circumferential surface of the heat sink 611 forms a part of the shell of the electronic circuit-integrated motor device 2.

The linked semiconductor module units 10, 20 are placed within the octagonal-column-shaped space that is formed in the radially inside part of the heat sink 611. The linked semiconductor module units 10, 20 are mounted on the radially inside part of a sidewall 612 of the heat sink 611, bent along the sidewall surfaces 615 of the heat sink 611, and disposed around the rotation axis of the motor 30. Six semiconductor modules 501 to 506, which form the linked semiconductor module units 10, 20, are disposed, one by one, on the sidewall surfaces 615, which face the radially inside part of the heat sink 611. The heat dissipation surfaces (largest surface areas) of the semiconductor modules 501 to 506 are disposed in planar contact with the sidewall surfaces 615.

The coil terminal 508 is bent in a radially inward direction to support the lead wire by clamping it. This ensures that the semiconductor modules 501 to 506 are directly connected to the motor coil and not routed through the printed circuit board. Meanwhile, the capacitor terminals 510 are bent in a radially inward direction and directly connected to the terminals of the capacitors 701 to 706.

The tenth embodiment produces the same advantages as the first embodiment. In addition, the capacitors 701 to 706 for the semiconductor modules 501 to 506 are disposed opposite the heat sink 611. This eliminates the need of providing the heat sink 611 with accommodation sections where the capacitors 701 to 706 are disposed.

Eleventh Embodiment

Figure 34:
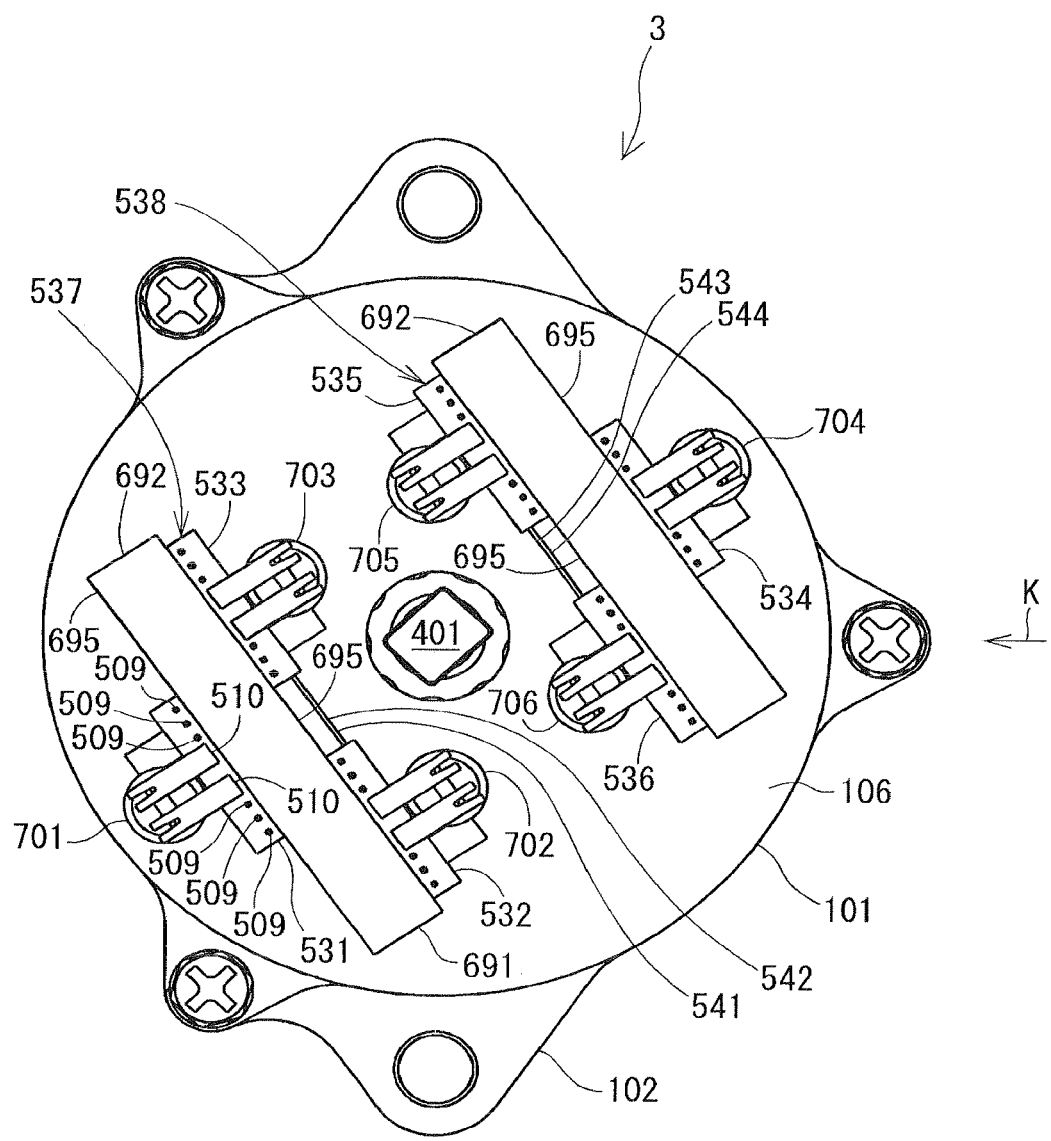
FIG. 34 is a top plan view showing an electronic circuit-integrated motor device that uses a linked semiconductor module unit according to the eleventh embodiment of the present invention.
Figure 35:
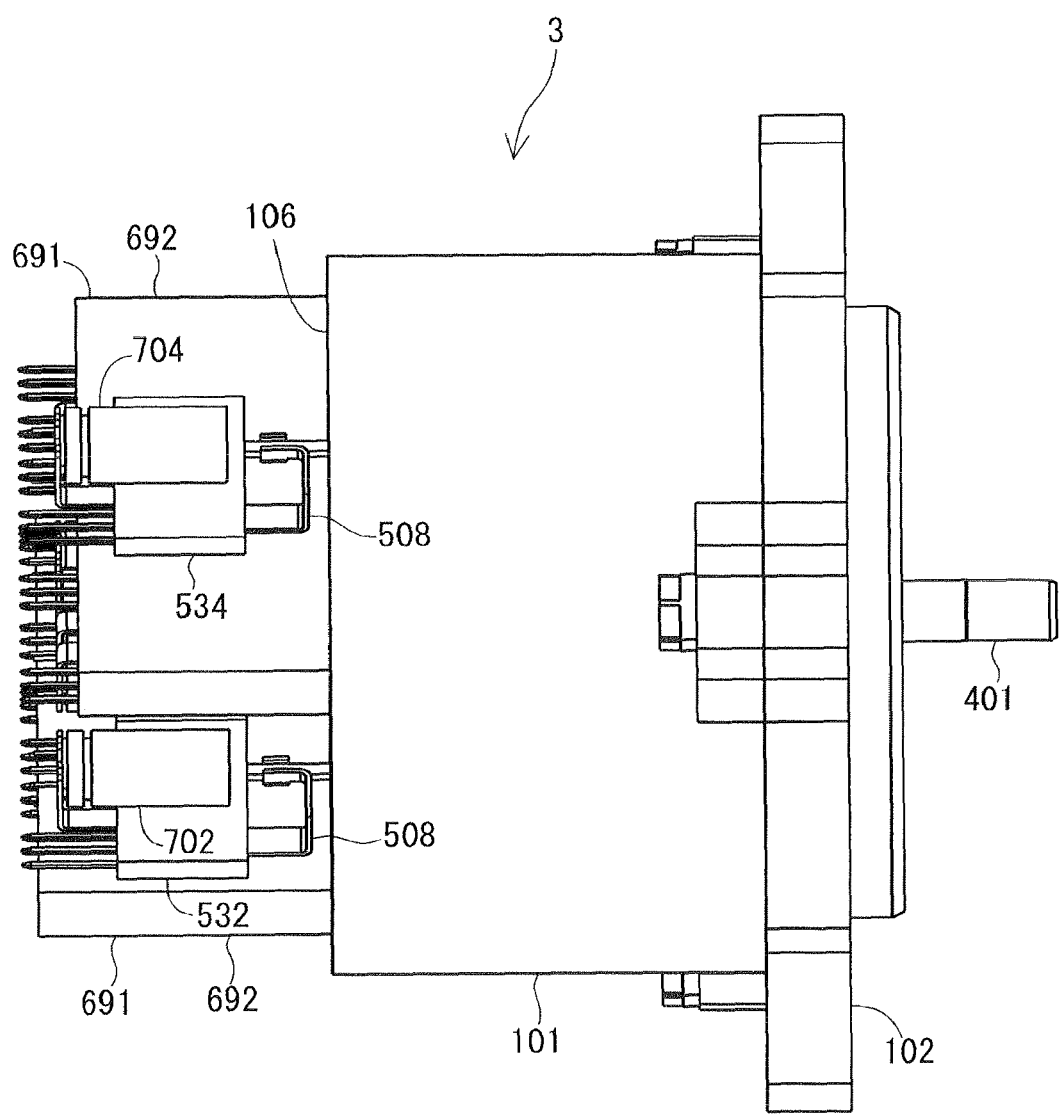
FIG. 35 is a side view showing the electronic circuit-integrated motor device that uses the linked semiconductor module unit according to the eleventh embodiment.
Figure 36:
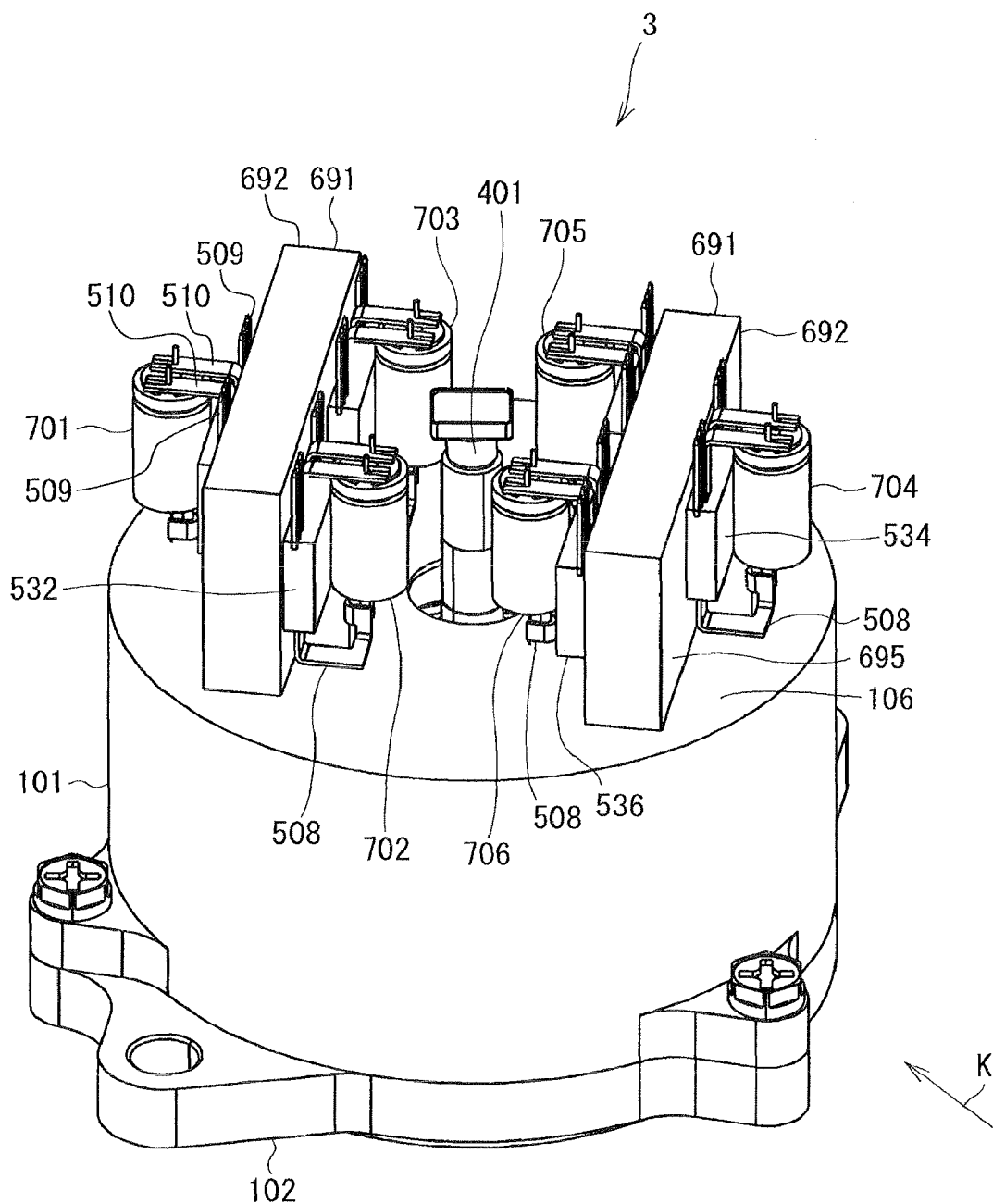
FIG. 36 is a perspective view showing the electronic circuit-integrated motor device that uses the linked semiconductor module unit according to the eleventh embodiment.

In an electronic circuit-integrated motor device 3 according to the eleventh embodiment, as shown in FIGS. 34 to 36, the electronic circuit-integrated motor device 3 includes six semiconductor modules 531, 532, 533, 534, 53 to 5536. The semiconductor modules 531 to 536 are mounted on a heat sink 691 that is mounted in a raised manner on the end wall 106 of the motor case 101.

As shown in FIG. 34, the heat sink 691 is configured so that the central axis of the shaft 401 is located between two columnar members 692 whose cross section perpendicular to the axial direction is rectangular in shape. The heat sink 691 includes the columnar members 692 that are disposed around the central axis of the shaft 401.

Further, the columnar members 692 of the heat sink 691 have four sidewall surfaces 695 that are perpendicular to the central axis of the shaft 401 and parallel to each other.

The six semiconductor modules 531 to 536 are disposed on the sidewall surfaces 695 of the heat sink 691. More specifically, four out of the six semiconductor modules are mounted on the two inner sidewall surfaces 695 out of the four sidewall surfaces 695, that is, two semiconductor modules are mounted on each of the two inner sidewall surfaces 695, and the remaining two semiconductor modules are mounted on the two outer sidewall surfaces 695, that is, each of the remaining two semiconductor modules is mounted on each of the two outer sidewall surfaces 695.

The linked semiconductor module unit 537 is formed by linking the semiconductor modules 532, 533 with two bus bars 541. One of the two bus bars 541 is connected to the power source 51, whereas the other bus bar is connected to the ground. The linked semiconductor module unit 538 is formed by linking the semiconductor modules 535, 536 with two bus bars 543. As is the case with the bus bars 541, one of the two bus bars 543 is connected to the power source 51 whereas the other bus bar is connected to the ground. The semiconductor module 531 is not linked to the other semiconductor module with bus bars. Similarly, the semiconductor module 534 is not coupled to the other semiconductor module with bus bars. It should be noted that, for example, bus bars and wires for locations where no semiconductor modules are coupled are not shown in FIGS. 34 to 36.

The semiconductor modules 531 to 536 are disposed in such a manner that their heat dissipation surfaces are in planar contact with the sidewall surfaces 695. In this instance, the sidewall surfaces 695 are flat surfaces. Accordingly, the heat dissipation surfaces of the semiconductor modules 531 to 536 are also flat surfaces. To ensure that the heat dissipation surfaces do not completely oppose each other with the columnar members 692 positioned in between, the semiconductor modules 531 to 536 are disposed so that the semiconductor modules on the outside of the columnar members 692 are displaced from those on the inside of the columnar members in the longitudinal direction of the columnar members 692. The semiconductor modules 532, 533 forming the linked semiconductor module unit 537 are disposed in the same plane. Therefore, the exposed portions 542 of the bus bars 541 remain linear in shape without being bent when used for the electronic circuit-integrated motor device 3. Similarly, the semiconductor modules 53 to 5536 forming the linked semiconductor module unit 538 are disposed in the same plane. Therefore, the exposed portions 544 of the bus bars 543 remain linear in shape without being bent when used for the electronic circuit-integrated motor device 3.

The semiconductor modules 531 to 536 include coil terminals 508 that protrude in a direction to the end wall 106 of the motor case 101 (FIGS. 35 and 36). Further, the semiconductor modules 531 to 536 include six control terminals 509 and two capacitor terminals 510 that protrude in a direction opposite the end wall 106 of the motor case 101 (FIGS. 34 to 36). The configuration described above is the same as for the foregoing embodiments.

As shown, for instance, in FIG. 34, six capacitors 701, 702, 703, 704, 705, 706 are provided for the semiconductor modules 501 to 506 and disposed near the control terminals 509, which are opposite to the heat sink 691.

The capacitors 701 to 706 are provided for the semiconductor modules 531 to 536 on a one-to-one basis, and disposed near the semiconductor modules 531 to 536. The capacitors 701 to 706 are cylindrical in shape and disposed so that their axes are parallel to the central axis of the shaft 401. Further, the capacitor terminals 510 of the semiconductor modules 531 to 536 are bent away from the sidewall surfaces 695 so that the terminals of the capacitors 701 to 706 are directly connected to the bent capacitor terminals 510.

The electronic circuit-integrated motor device 3 according to the present embodiment provides the same advantages as the foregoing embodiments.

Other Embodiments

In the foregoing embodiments, each linked semiconductor module unit is obtained by linking three semiconductor modules. Alternatively, however, any number of semiconductor modules may be coupled depending on the intended use. For example, the number of linked semiconductor module units may be determined in accordance with the number of motor coils.

In the foregoing embodiments, the linked semiconductor module units are assumed to be applied to an electronic circuit-integrated motor device for the electric power steering system. However, the linked semiconductor module units are not limited to use in the electronic circuit-integrated motor device, but are also applicable to various other uses. The linked semiconductor module units are particularly suitable for switching elements and other similar applications where semiconductor modules need to conduct a large current.

In the foregoing embodiments, the semiconductor modules are disposed along the heat sink that is mounted in a standing manner from the end wall 106 of the motor case 101 and oriented in the direction of the central axis of the shaft 401. Alternatively, however, the semiconductor modules may be disposed along the motor case 101. In such an instance, the axial length can be reduced although the radial size increases by the thickness of the semiconductor modules. This makes it possible to reduce the size of the electronic circuit-integrated motor device.

What is claimed is:

1. An electronic circuit-integrated motor device comprising:
 a tubular motor case;
 a stator positioned on a radially inside part of the motor case and wound with a multiple-phase coil;
 a rotor positioned in a radially inside part of the stator;
 a shaft fit in the rotor to be rotatable the rotor;
 a plurality of semiconductor modules, each having a switching element for changing a coil current flowing to the multiple-phase coil; and
 a linking member linking the plurality of semiconductor modules to form a linked semiconductor module unit,
 wherein each of the semiconductor modules includes at least one semiconductor chip that forms the switching element, a land on which the semiconductor chip is mounted, and a resin part that encapsulates the semiconductor chip and embeds the land therein,
 wherein the linking member is comprised of embedded portions, each embedded in a respective said resin part, and exposed portions that extend between the embedded portions and are exposed from the resin parts, said embedded portions and said exposed portions being formed integrally and continuously in one piece,
 wherein the linking member includes a bent portion that is bent at the exposed portion, and
 further comprising a heat sink mounted on an axial end wall of the motor case in a raised manner, wherein the linked semiconductor module unit is bent at a radially inside part of the heat sink along the heat sink, and positioned around a rotation axis of the motor.

2. The electronic circuit-integrated motor device according to claim 1, wherein:
 the linking member includes a first conductive member and a second conductive member, the first conductive member being connected to a power source, the second conductive member being electrically connected with a connection member to the heat sink connected to a ground.

3. The electronic circuit-integrated motor device according to claim 1, wherein:
 the plurality of semiconductor modules are disposed within an axial projection range of the motor case.

4. The electronic circuit-integrated motor device according to claim 1, further comprising:
 a control circuit connected to the semiconductor modules for controlling an on/off operation of the switching element of each of the semiconductor modules,
 wherein each of the semiconductor modules has control terminals connecting the control circuit and the switching element, and
 wherein the linking member is conductive to supply power to the switching element of each of the semiconductor modules.

5. The electronic circuit-integrated motor device according to claim 1, wherein:
 the land of each said semiconductor module is formed integrally with said linking member.

* * * * *